US012696570B2

(12) United States Patent　　　　(10) Patent No.:　US 12,696,570 B2

Ishiwata et al.　　　　　　　　　　(45) Date of Patent:　　　Jul. 28, 2026

(54) LIGHT-RECEIVING DEVICE, X-RAY IMAGING DEVICE, AND ELECTRONIC APPARATUS

(71) Applicants: SONY SEMICONDUCTOR SOLUTIONS CORPORATION, Kanagawa (JP); RIKEN, Saitama (JP)

(72) Inventors: Hiroaki Ishiwata, Kanagawa (JP); Chihiro Arai, Kanagawa (JP); Hikaru Iwata, Kanagawa (JP); Takaki Hatsui, Saitama (JP); Takahiro Kawamura, Kanagawa (JP); Kazunobu Ota, Kanagawa (JP)

(73) Assignees: Sony Semiconductor Solutions Corporation, Kanagawa (JP); RIKEN, Saitama (JP)

( * ) Notice: Subject to any disclaimer, the term of this patent is extended or adjusted under 35 U.S.C. 154(b) by 321 days.

(21) Appl. No.: 18/575,370

(22) PCT Filed: Mar. 25, 2022

(86) PCT No.: PCT/JP2022/014366

§ 371 (c)(1),
(2) Date: Dec. 29, 2023

(87) PCT Pub. No.: WO2023/281856

PCT Pub. Date: Jan. 12, 2023

(65) Prior Publication Data

US 2025/0006768 A1　　　Jan. 2, 2025

(30) Foreign Application Priority Data

Jul. 6, 2021　　(JP) ................................. 2021-112165

(51) Int. Cl.
*H10F 39/00*　　　(2025.01)
*H10F 39/18*　　　(2025.01)

(52) U.S. Cl.
CPC ....... *H10F 39/811* (2025.01); *H10F 39/1892* (2025.01); *H10F 39/8027* (2025.01)

(58) Field of Classification Search
CPC ............... H10F 39/811; H10F 39/1892; H10F 39/8027; H10F 30/20; H10F 39/802; H10F 39/807; H10F 77/148; H04N 5/32
See application file for complete search history.

(56) References Cited

U.S. PATENT DOCUMENTS

2007/0228423 A1 * 10/2007　Watanabe ........... H10F 39/1892
　　　　　　　　　　　　　　　257/229
2008/0315265 A1　　12/2008　Aurola
(Continued)

FOREIGN PATENT DOCUMENTS

JP　　　H11-004012　　　1/1999
JP　　　2009-522821　　　6/2009
(Continued)

OTHER PUBLICATIONS

International Search Report and Written Opinion prepared by the Japan Patent Office on May 25, 2022, for International Application No. PCT/JP2022/014366, 3 pgs.
(Continued)

*Primary Examiner* — Douglas W Owens
(74) *Attorney, Agent, or Firm* — SHERIDAN ROSS P.C.

(57)　　　　ABSTRACT

A light-receiving device includes: a semiconductor substrate including a light-receiving region with light-receiving elements arranged two-dimensionally in matrix, and a peripheral region provided therearound; a first first electrically-conductive region provided at a first surface of the semiconductor substrate for each element and coupled to a first electrode, in the light-receiving region; a second first electrically-conductive region provided at the first surface and around the first first region provided for each element and coupled to a second electrode; a third first electrically-
(Continued)

conductive region provided at the first surface and around the second first region provided for each element and having electrically floating state; a fourth first electrically-conductive region provided at the first surface and around the light-receiving region and having electrically floating state, in the peripheral region; and a first second electrically-conductive region embeddedly formed in the semiconductor substrate and facing the second, third, and fourth first regions.

20 Claims, 22 Drawing Sheets

(56) References Cited

U.S. PATENT DOCUMENTS

| | | | |
|---|---|---|---|
| 2010/0133441 A1 | 6/2010 | Aurola | |
| 2010/0245809 A1 | 9/2010 | Andreou et al. | |
| 2012/0086079 A1* | 4/2012 | Kasai | H10F 39/8027 |
| | | | 257/431 |
| 2020/0150287 A1 | 5/2020 | Cao et al. | |
| 2021/0151480 A1 | 5/2021 | Cao et al. | |
| 2023/0080926 A1* | 3/2023 | Nakano | H10F 39/8057 |
| | | | 250/361 R |
| 2024/0186340 A1* | 6/2024 | Hatsui | H10F 39/189 |
| 2024/0194701 A1* | 6/2024 | Hatsui | H10F 77/206 |

FOREIGN PATENT DOCUMENTS

| | | |
|---|---|---|
| WO | WO 2006/018470 | 2/2006 |
| WO | WO 2019/123591 | 6/2019 |
| WO | WO 2020/010592 | 1/2020 |
| WO | WO 2020/075051 | 4/2020 |

OTHER PUBLICATIONS

Segal et al., "A new structure for controlling dark current due to surface generation in drift detectors," Nuclear Instruments and Methods in Physics Research A, vol. 414, 1998, pp. 007-316.

* cited by examiner

LIGHT-RECEIVING DEVICE, X-RAY IMAGING DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2022/014366, having an international filing date of 25 Mar. 2022, which designated the United States, which PCT application claimed the benefit of Japanese Patent Application No. 2021-112165, filed 6 Jul. 2021, the entire disclosures of each of which are incorporated herein by reference.

TECHNICAL FIELD

The present disclosure relates to a light-receiving device, an X-ray imaging device, and an electronic apparatus that are suitable for X-ray photography for medical application or non-destructive examination, for example.

Solid-state imaging devices are used in various applications including, for example, an imaging device such as a digital still camera or a video camera, an electronic apparatus such as a mobile terminal apparatus having an imaging function, or an electromagnetic wave sensor that detects various wavelengths other than that of visible light. Examples of the solid-state imaging devices include an APS (Active Pixel Sensor) including an amplifying element for each pixel; a CMOS (complementary MOS) image sensor (CIS) has been widely used that reads signal charge accumulated in a photodiode, as a photoelectric conversion element, via a MOS (Metal Oxide Semiconductor) transistor.

As a sensor for scientific use that requires high sensitivity measurement, a light-receiving element (PIN photodiode) has been used that has a structure in which a photoelectric conversion region and a floating diffusion region (Floating Diffusion; FD) are integrated (see, e.g., PTL 1). Such a light-receiving element is easy to be manufactured from a simple structure. In addition, any electric potential difference can be applied to a p-n junction that forms a photoelectric conversion region. This makes it easy to increase the thickness of the photoelectric conversion region.

CITATION LIST

Patent Literature

PTL 1: Japanese Unexamined Patent Application Publication No. H11-4012

SUMMARY OF THE INVENTION

Incidentally, a light-receiving device used as an X-ray imaging device is required to reduce dispersion of pixel characteristics across the entire surface of a pixel array.

It is desirable to provide a light-receiving device, an X-ray imaging device, and an electronic apparatus that make it possible to reduce dispersion of pixel characteristics in a light-receiving region.

A light-receiving device according to an embodiment of the present disclosure includes: a semiconductor substrate including a light-receiving region in which a plurality of light-receiving elements are arranged two-dimensionally in matrix, and a peripheral region provided around the light-receiving region; a first first electrically-conductive region provided at an interface of a first surface of the semiconductor substrate for each of the light-receiving elements and coupled to a first electrode, in the light-receiving region; a second first electrically-conductive region provided around the first first electrically-conductive region provided for each of the light-receiving elements and coupled to a second electrode, at the interface of the first surface; a third first electrically-conductive region provided around the second first electrically-conductive region provided for each of the light-receiving elements and being in an electrically floating state, at the interface of the first surface; a fourth first electrically-conductive region provided at the interface of the first surface of the semiconductor substrate around the light-receiving region and being in an electrically floating state, in the peripheral region; and a first second electrically-conductive region embedded and formed in the semiconductor substrate and facing the second first electrically-conductive region, the third first electrically-conductive region, and the fourth first electrically-conductive region.

An X-ray imaging device according to an embodiment of the present disclosure includes the light-receiving device according to the embodiment of the present disclosure including a plurality of light-receiving elements generating signal charge based on an X-ray.

An electronic apparatus according to an embodiment of the present disclosure includes the X-ray imaging device according to the embodiment of the present disclosure.

In the light-receiving device according to the embodiment of the present disclosure, the X-ray imaging device according to the embodiment of the present disclosure, and the electronic apparatus according to the embodiment of the present disclosure, around a light-receiving region, in which a plurality of light-receiving elements are arranged two-dimensionally in matrix, the plurality of light-receiving elements each including: a first first electrically-conductive region provided at an interface of a first surface of the semiconductor substrate and coupled to a first electrode; a second first electrically-conductive region provided around the first first electrically-conductive region and coupled to a second electrode; and a third first electrically-conductive region provided therearound and being in an electrically floating state, a fourth first electrically-conductive region in an electrically floating state is provided, and a first second electrically-conductive region facing the second first electrically-conductive region and the third first electrically-conductive region and further extending to the fourth first electrically-conductive region is embedded and formed in the semiconductor substrate. This reduces fluctuation in a potential of the light-receiving element arranged on the outermost periphery of the light-receiving region.

MODES FOR CARRYING OUT THE INVENTION

Figure 1:
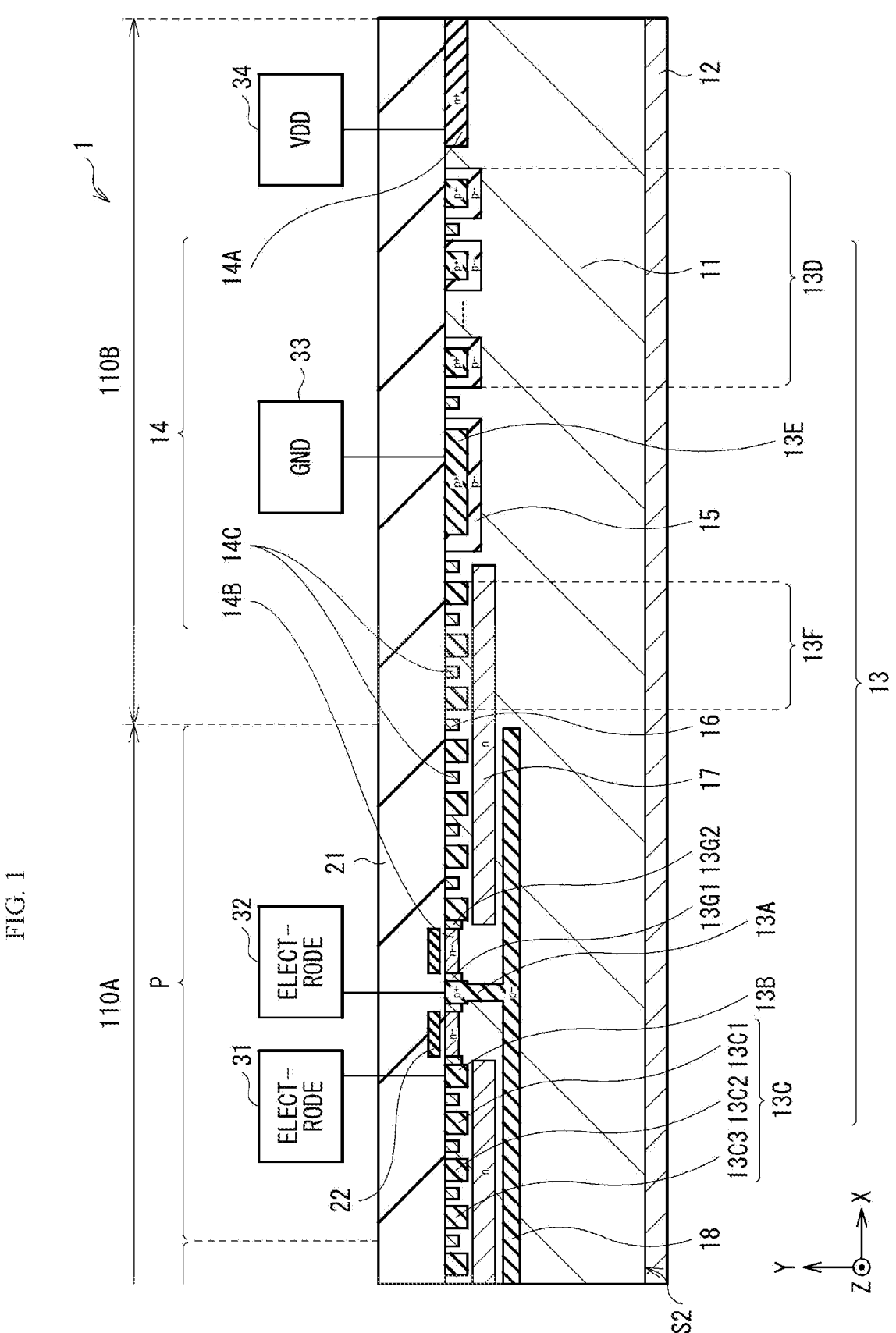
FIG. 1 is a schematic cross-sectional view of an example of a configuration of a light-receiving device according to an embodiment of the present disclosure.

In the following, a description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. Embodiment (An example of an imaging device including a pixel edge guard ring provided around a light-receiving region and an embedded layer extending to below the pixel edge guard ring)
2. Modification Examples
2-1. Modification Example 1 (An example in which with an embedded layer having a high concentration is provided below the pixel edge guard ring)
2-2. Modification Example 2 (Another example of a layout of the pixel edge guard ring)
2-3. Modification Example 3 (An example in which an n-type electrically-conductive region having a high concentration is provided between the pixel edge guard rings)
2-4. Modification Example 4 (Another example of the layout of the pixel edge guard ring)
2-5. Modification Example 5 (An example in which with a barrier layer is extended to a peripheral region)
2-6. Modification Example 6 (Another example of the layout of the pixel edge guard ring)
2-7. Modification Example 7 (Another modification example)
3. Application Example

1. Embodiment

Figure 2:
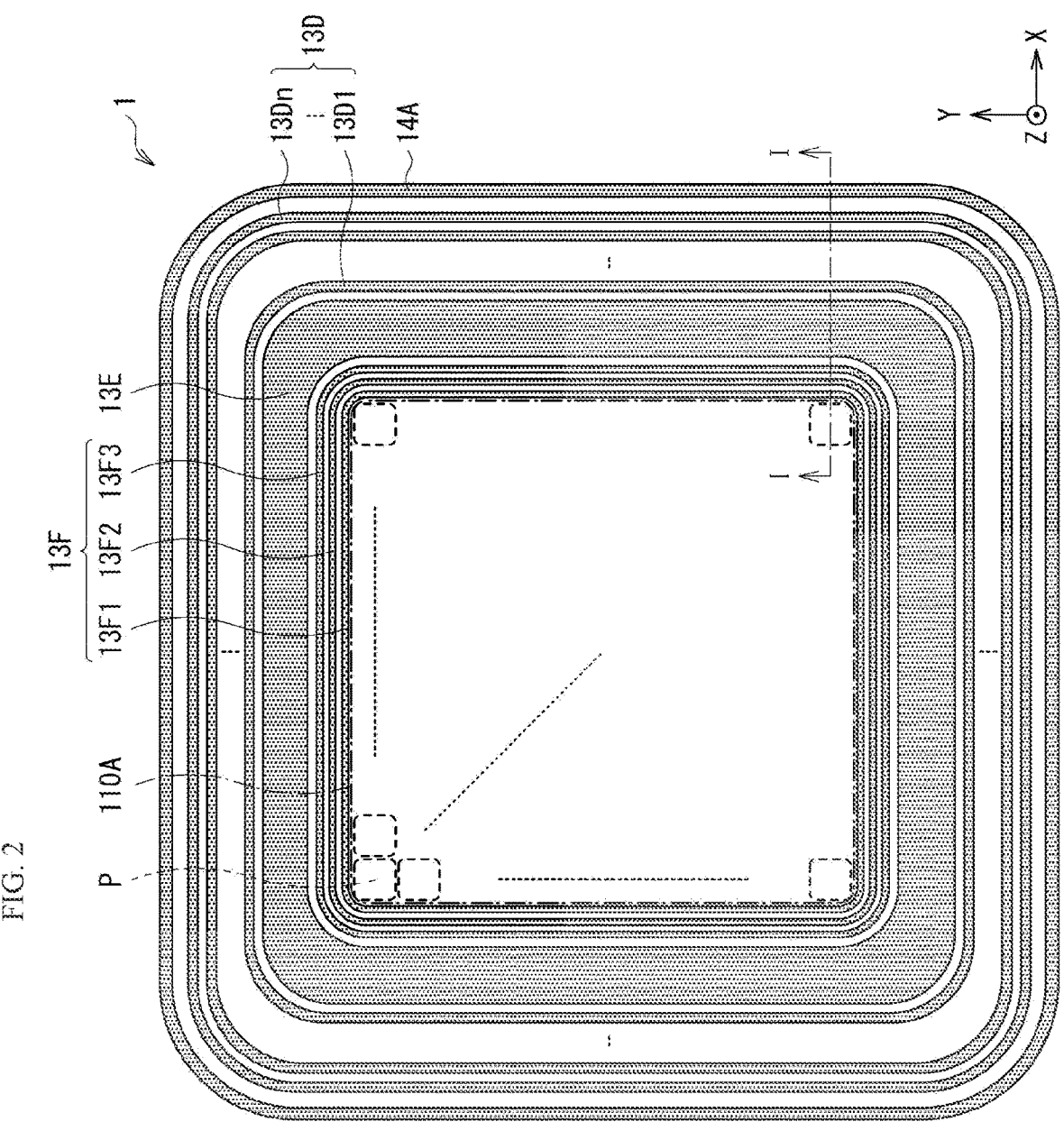
FIG. 2 is a schematic plan view of an overall configuration of the light-receiving device illustrated in FIG. 1.

FIG. 1 schematically illustrates an example of a cross-sectional configuration of a light-receiving device (a light-receiving device 1) according to an embodiment of the present disclosure. FIG. 2 schematically illustrates a planar configuration of the entire light-receiving device 1 illustrated in FIG. 1, and FIG. 1 illustrates a cross-section thereof taken along a line I-I indicated in FIG. 2. The light-receiving device 1 is adaptable to an electromagnetic wave detector or a radiation imaging device (e.g., an X-ray imaging device 100; see FIG. 21) to read information on a subject (to capture an image of a subject) on the basis of a radioactive ray (e.g., α-ray, β-ray, γ-ray, and X-ray, etc.).

[Configuration of Light-Receiving Device]

The light-receiving device 1 includes a light-receiving region 110A and a peripheral region 110B provided around the light-receiving region 110A. In the light-receiving region 110A, light-receiving elements, each of which serves as one pixel (a unit pixel P), are arranged two-dimensionally in a row direction and a column direction. The light-receiving elements each include a PIN (Positive Intrinsic Negative) type photodiode that applies a reverse bias between a front surface S1 (first surface) and a back surface S2 (second surface) of a semiconductor substrate 11.

It is to be noted that, in the present embodiment, a description is given of a case where holes, of excitons (electron/hole pairs) generated by photoelectric conversion, are read as signal charge. In addition, in the drawings, "−(minus)" attached to "p" and "n" indicates that a p-type or n-type impurity has a low concentration, and "+ (plus)" indicates that the p-type or n-type impurity has a high concentration. The magnitude relationships among concentrations of the p-type and n-type impurities are $p < p < p+$ and $n < n < n+$, respectively.

The semiconductor substrate 11 is configured by, for example, an n-type, p-type, or i-type (intrinsic semiconductor) semiconductor, and includes, therein, a p-i-n junction or a p-n junction to serve as a photoelectric conversion region. In the present embodiment, an n-type semiconductor substrate is used as the semiconductor substrate 11, and a p-type electrically-conductive region 13 (first electrically-conductive region) and an n-type electrically-conductive region 14 (second electrically-conductive region) are partially formed at an interface of the front surface S1. An n-type electrically-conductive layer (second electrically-conductive layer) 12 is formed at an interface of a back surface S2 opposed to the front surface S1. A film thickness (hereinafter, simply referred to as a "thickness") of the semiconductor substrate 11 in a stacking direction (Y-axis direction) is, for example, 10 μm or more and 700 μm or less.

As the semiconductor substrate 11, for example, a silicon substrate is used, but this is not limitative. As the semiconductor substrate 11, for example, there may be used a substrate including germanium (Ge), gallium arsenide (GaAs), indium gallium arsenide (InGaAs), zinc selenium (ZnSe), gallium nitride (GaN), indium gallium nitride (InGaN), or the like.

The p-type electrically-conductive region 13 is a region (p-type impurity region) in which p-type impurities are dispersed, and a plurality of p-type electrically-conductive regions 13 is formed at the interface of the front surface S1 of the semiconductor substrate 11. Specifically, the p-type electrically-conductive region 13 includes six regions of a region constituting an anode 13A, a region constituting a drain 13B, a region constituting a guard ring 13C, a region constituting a high-voltage guard ring 13D, a region constituting a charge collection ring (CCR) 13E, and a region constituting a pixel edge guard ring 13F; the regions are spaced apart from each other. The anode 13A, the drain 13B, and the guard ring 13C are provided in the light-receiving region 110A, for example, for each unit pixel P. The high-voltage guard ring 13D, the CCR 13E, and the pixel edge guard ring 13F are provided in the peripheral region 110B.

The n-type electrically-conductive region 14 is a region in which n-type impurities are diffused (n-type impurity region), and a plurality of n-type electrically-conductive regions 14 is formed at the interface of the front surface S1 of the semiconductor substrate 11. Specifically, the n-type electrically-conductive region 14 includes a region constituting a cathode 14A and one or a plurality of n-type electrically-conductive regions 14B and 14C, with the regions being spaced apart from each other. The cathode 14A is provided in the peripheral region 110B. The n-type electrically-conductive region 14B is provided around the anode 13A. The n-type electrically-conductive region 14C is provided between the plurality of p-type electrically-conductive regions provided at the interface of the front surface S1 of the semiconductor substrate 11.

An insulating layer 21 including, in the layer, one or a plurality of wiring layers in layers is provided on a side of the front surface S1 of the semiconductor substrate 11.

Although not illustrated, on the insulating layer 21, there is disposed a substrate in which there are formed, for example, electrodes 31 and 32 that applies a predetermined voltage to the anode 13A, the drain 13B, the CCR 13E and the cathode 14A, as well as a ground (GND) 33, a power supply (VDD) 34, a logic circuit, etc.

[Configuration of Light-Receiving Region]

In the light-receiving region 110A, as described above, a plurality of unit pixels P are arranged two-dimensionally in matrix (in a matrix manner). Each unit pixel P is provided with a light-receiving element including a PIN type photodiode that applies a reverse bias, as described above.

The unit pixel P (light-receiving element) includes the anode 13A, the drain 13B, and a plurality of guard rings 13C (13C1, 13C2, and 13C3) at the interface of the front surface S1 of the semiconductor substrate 11. The n-type electrically-conductive region 14B is provided between the anode 13A and the drain 13B at the interface of the front surface S1 of the semiconductor substrate 11, and p-type impurity regions having concentrations lower than those of the anode 13A and the drain 13B are provided between the anode 13A and the drain 13B and in a manner adjacent to the anode 13A and the drain 13B, respectively. For the sake of convenience, the p-type impurity region having a low concentration between the anode 13A and the n-type electrically-conductive region 14B is referred to as Lightly Doped Anode (LDA) 13G1, and the p-type impurity region having a low concentration between the drain 13B and the n-type electrically-conductive region 14B is referred to as Lightly Doped Drain (LDD) 13G2. The n-type electrically-conductive region 14C is provided between the plurality of guard rings 13C1, 13C2, and 13C3 at the interface of the front surface S1 of the semiconductor substrate 11. An embedded layer 17 including an n-type impurity diffusion layer and a barrier layer 18 including a p-type impurity diffusion layer are formed inside the semiconductor substrate 11. The unit pixel P is further provided with a gate electrode 22 in the insulating layer 21 between the anode 13A and the drain 13B.

The anode 13A is a p-type impurity region including p-type impurities at a concentration of $1e^{18}$ cm$^{-3}$ to $1e^{21}$ cm$^{-3}$, for example, and corresponds to a specific example of a "first first electrically-conductive region" of the present disclosure. The anode 13A receives application of a voltage to read holes (h+) as signal charge, for example, among carriers generated by photoelectric conversion; the anode 13A is coupled to an electrode 31 (first electrode). For example, the anode 13A is individually formed at substantially the middle of the unit pixel P. The planar shape of the anode 13A is not particularly limited, and may be a circular shape (see, e.g., FIG. 3) or a polygonal shape. For example, the anode 13A partially protrudes to a side of the back surface S2 from a bottom surface of the embedded layer 17 described later. A size of the anode 13A is, for example, 0.1 μm or more and 10 μm or less in a case where the pitch of the unit pixel P is 10 μm or more and 100 μm or less, for example, depending on a size of the unit pixel P.

The drain 13B is a p-type impurity region including p-type impurities at a concentration of $1e^{18}$ cm$^{-3}$ to $1e^{21}$ cm$^3$, for example, and corresponds to a specific example of a "second first electrically-conductive region" of the present disclosure. The drain 13B receives application of a voltage to discharge a dark current generated at the interface of the front surface S1 of the semiconductor substrate 11 at the time of X-ray irradiation, for example; the drain 13B is coupled to, for example, an electrode 32 (second electrode). The drain 13B is formed in a ring shape around the anode 13A, and the dark current generated due to X-ray irradiation at the interface of the front surface S1 of the semiconductor substrate 11 is constantly discharged from the drain 13B. This makes it possible to prevent the dark current from flowing into the anode 13A. A planar shape of the drain 13B is not particularly limited, and may be an annular shape or a polygonal shape (see, e.g., FIG. 3).

Figure 3:
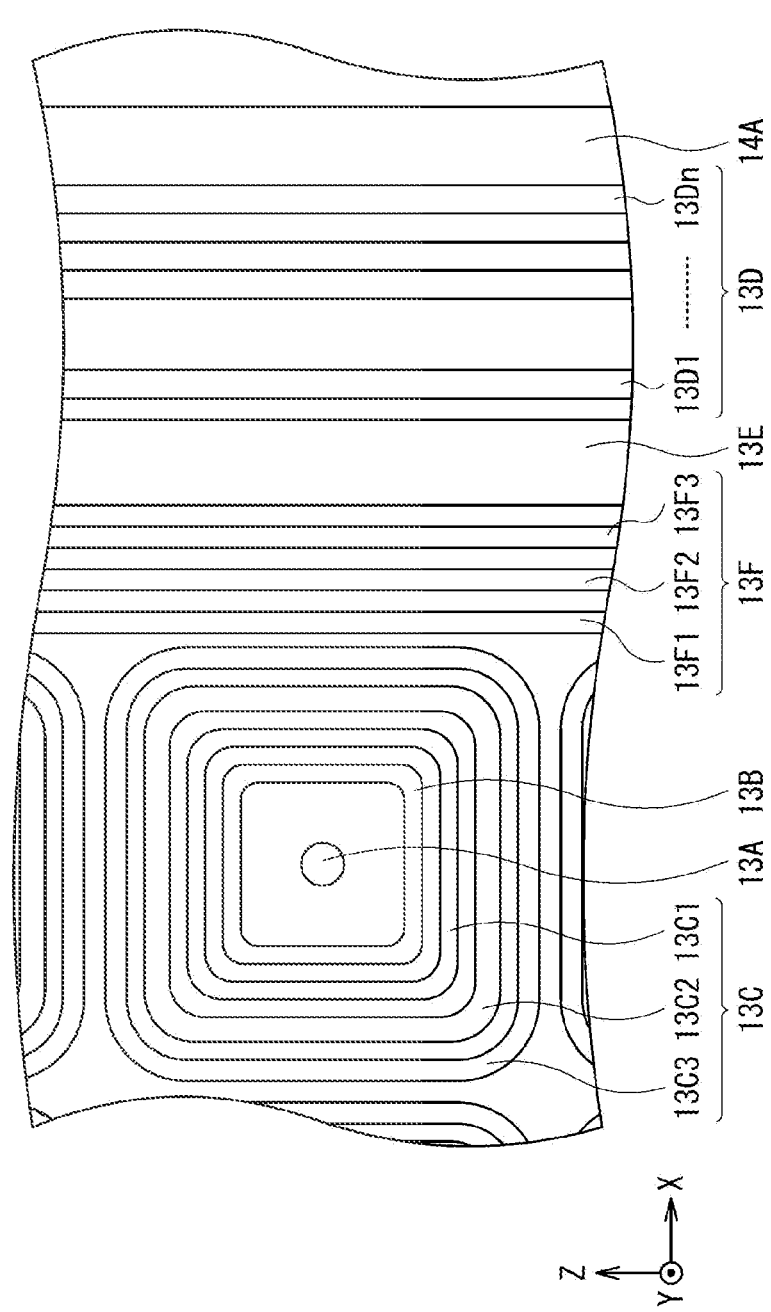
FIG. 3 is a schematic plan view of a pattern of diffusion of impurities at a front surface of a semiconductor substrate of the light-receiving device illustrated in FIG. 1.

The guard ring 13C is a p-type impurity region including p-type impurities at a concentration of $1e^{18}$ cm$^{-3}$ to $1e^{21}$ cm$^{-3}$, for example, and corresponds to a specific example of a "third first electrically-conductive region" of the present disclosure. The guard ring 13C is provided to generate a horizontal electric field that alleviates the concentration of an electric field on the drain 13B and simultaneously assists transfer of signal charge (holes) in a horizontal direction (e.g., X-Y plane direction). The guard ring 13C is formed in a ring shape around the drain 13B to surround the anode 13A and the drain 13B. Unlike the anode 13A and drain 13B, the guard ring 13C is in an electrically floating state. For example, a plurality of guard rings 13C is formed at the interface of the front surface S1 of the semiconductor substrate 11 substantially concentrically or substantially concentrically and polygonally about the anode 13A, for example. Specifically, as illustrated in FIGS. 1 and 3, the guard ring 13C includes, for example, three p-type electrically-conductive regions, and is formed triply (guard rings 13C1, 13C2, and 13C3) around the drain 13B. In this manner, providing the plurality of guard rings 13C enables the concentrated electric field to be distributed to a plurality of locations and at the same time to generate the horizontal electric field in a wide region.

In a case where the drain 13B and the guard ring 13C are formed to have a polygonal shape (e.g., a rectangular shape), the corners are preferably formed to have a curved shape, as illustrated in FIG. 3. This allows the concentration of the electric field at the corners to be alleviated. In addition, although FIG. 3 exemplifies the drain 13B and the guard ring 13C being continuously provided around the anode 13A, this is not limitative. For example, a portion thereof may be cut, or, alternatively, they may be formed intermittently.

A linewidth of the ring constituting the drain 13B and the guard ring 13C is, for example, 0.100 μm or more and 10 μm or less. An interval between the drain 13B and the guard ring 13C is, for example, 0.100 μm or more and 10 μm or less. It is to be noted that the linewidths of the drain 13B and the guard ring 13C are not necessarily constant.

The n-type electrically-conductive layer 12 is a layer including n-type impurities at a concentration of $1e^{18}$ cm$^{-3}$ to $1e^{21}$ cm$^{-3}$, for example, and is formed at the interface of the back surface S2 of the semiconductor substrate 11. The n-type electrically-conductive layer 12 receives application of a power-supply voltage from the cathode 14A provided at the interface of the front surface S1 of the semiconductor substrate 11 via a neutral region formed outside a depletion region formed in the semiconductor substrate 11, for example, in the peripheral region 110B. Thus, in a case where, holes, for example, among carriers generated by photoelectric conversion, are read as signal charge through the anode 13A, electrons (e$^-$) are discharged from the cathode 14A through the n-type electrically-conductive layer 12. As for a thickness, for example, the n-type electrically-conductive layer 12 is formed at a thickness of 1 μm, for example, from the interface of the back surface S2 of the semiconductor substrate 11, for example, in a case where the pitch of the unit pixel P is 10 μm or more and 100 μm or less, depending on the configuration of the unit pixel P.

It is to be noted that a method of coupling a power supply to the n-type electrically-conductive layer 12 is not limited to those described above. For example, an electrode may be formed on the n-type electrically-conductive layer 12, and the VDD 34 may be coupled thereto to apply a power-supply voltage from the side of the back surface S2 of the semiconductor substrate 11.

The n-type electrically-conductive region 14B is provided near the interface of the front surface S1 of the semiconductor substrate 11 between the anode 13A and the drain 13B. The n-type electrically-conductive region 14B includes n-type impurities at a concentration of $1e^{16}$ cm$^{-3}$ to $1e^{19}$ cm$^{-3}$, for example. As for a thickness, for example, the n-type electrically-conductive region 14B is formed at a thickness of 0.1 μm to 3 μm, for example, from the interface of the front surface S1 of the semiconductor substrate 11, for example, in a case where the pitch of the unit pixel P is 10 μm or more and 100 μm or less, depending on the configuration of the unit pixel P.

The n-type electrically-conductive region 14C is provided at the interface of the front surface S1 of the semiconductor substrate 11 between the drain 13B and the guard ring 13C1 and between the guard rings 13C1, 13C2, and 13C3 adjacent to each other. The n-type electrically-conductive region 14C includes n-type impurities at a concentration of $1e^{16}$ cm$^{-3}$ to $1e^{19}$ cm$^{-3}$, for example. As for a thickness, for example, the n-type electrically-conductive region 14C is formed at a thickness of 0.1 μm to 3 μm, for example, from the interface of the front surface S1 of the semiconductor substrate 11, for example, in a case where the pitch of the unit pixel P is 10 μm or more and 100 μm or less, depending on the configuration of the unit pixel P.

The LDD 13G1 and the LDD 13G2 are provided at the interface of the front surface S1 of the semiconductor substrate 11, respectively, between the anode 13A and the n-type electrically-conductive region 14B and between the n-type electrically-conductive region 14B and the drain 13B. The LDD 13G1 and the LDD 13G2 each have an impurity concentration that is lower than the impurity concentration of the p-type electrically-conductive region 13 constituting the anode 13A, the drain 13B, and the guard ring 13C. The impurity concentration of the LDD 13G1 and the LDD 13G2 is, for example, such a concentration that allows for depletion by a fixed electric charge (holes) generated at the interface of the insulating layer 21 with respect to the front surface S1 of the semiconductor substrate 11 due to X-ray radiation. Specifically, the impurity concentration of the LDD 13G1 and the LDD 13G2 is a low concentration, in which the peak concentration is $1e^{19}$ cm$^{-3}$ or less, depending on an amount of X-ray irradiation, for example. As for a thickness, for example, the LDD 13G1 and the LDD 13G2 are each formed at a thickness of 0.1 μm to 3 μm, for example, from the interface of the front surface S1 of the semiconductor substrate 11, for example, in a case where the pitch of the unit pixel P is 10 μm or more and 100 μm or less, depending on the configuration of the unit pixel P.

The embedded layer 17 corresponds to a specific example of a "first second electrically-conductive region" of the present disclosure. The embedded layer 17 is provided to prevent holes (signal charge), among carriers generated in the semiconductor substrate 11 by photoelectric conversion, from being transferred to the drain 13B or the guard ring 13C. The embedded layer 17 is configured by an n-type impurity diffusion layer including n-type impurities at a concentration of $1e^{14}$ cm$^{-3}$ to $1e^{17}$ cm$^{-3}$, for example, inside the semiconductor substrate 11, specifically, near the p-type electrically-conductive region 13. More particularly, the embedded layer 17 is provided in a region corresponding to the drain 13B and the guard ring 13C, and has an opening in a region facing the anode 13A. This allows signal charge generated in the semiconductor substrate 11 to be efficiently read from the anode 13A. It is to be noted that the embedded layer 17 is formed not to be in direct contact with the drain 13B and the guard ring 13C. The embedded layer 17 is disposed at a position which is distant, by 1 μm or more and 10 μm or less, from the front surface S1 of the semiconductor substrate 11, for example.

The barrier layer 18 corresponds to a specific example of a "sixth first electrically-conductive region" of the present disclosure. A barrier layer 23 is provided to prevent signal charge from being lost from the guard ring 13C to the drain 13B. The barrier layer 18 is formed inside the semiconductor substrate 11 at a position facing the embedded layer 17 on a side closer to the back surface S2 than the embedded layer 17. The barrier layer 18 is formed to extend across a plurality of unit pixels P, for example, and is in contact with the anode 13A at the center of the unit pixel P, for example. The barrier layer 18 is configured by a p-type impurity diffusion layer including p-type impurities at a concentration of $1e^{14}$ cm$^{-3}$ to $1e^{17}$ cm$^{-3}$, for example. The p-type impurities have an impurity concentration equal to or less than an impurity concentration of the n-type electrically-conductive region that constitutes the embedded layer 17. The barrier layer 18 is formed at a position deeper than the embedded layer 17, and is disposed, for example, at a position which is distant, by 1.1 μm or more and 11 μm or less, from the front surface S1 of the semiconductor substrate 11.

The insulating layer 21 is formed using an inorganic insulating material. Examples of the inorganic insulating material include silicon oxide (SiO$_2$), silicon nitride (SiN), aluminum oxide (Al$_2$O$_3$), and hafnium oxide (HfO$_2$). The insulating layer 21 is formed to include at least one of these materials. In the insulating layer 21, for example, there are formed one or a plurality of wiring layers formed using a metal material, polysilicon (poly-Si), or the like.

The gate electrode 22 is provided in the insulating layer 21 between the anode 13A and the drain 13B, for example. The gate electrode 22 is provided to apply an electric field to the interface of the front surface S1 of the semiconductor substrate 11 between the anode 13A and the drain 13B. Specifically, the gate electrode 22 applies an electric field in a direction to distance holes, generated near the interface of the front surface S1 of the semiconductor substrate 11, away from the interface of the semiconductor substrate 11. More specifically, a minus (−) voltage with respect to an electric potential of the semiconductor substrate 11 is applied to the gate electrode 22, thereby applying an electric field of, for example, 0.5 MV/cm or more to the interface of the front surface S1 of the semiconductor substrate 11. In addition, the gate electrode 22 is provided to reduce the volume of the insulating layer 21 provided on the semiconductor substrate 11 between the anode 13A and the drain 13B, for example. This reduces an increase in positive fixed electric charge generated in the insulating layer 21 near the interface of the insulating layer 21 with respect to the front surface S1 of the semiconductor substrate 11 due to X-ray irradiation as well as an increase in an interface state of the front surface S1 of the semiconductor substrate 11. For example, the gate electrode 22 is provided between the anode 13A and the drain 13B to surround the anode 13A in a plan view. The gate electrode 22 can be formed using, for example, polysilicon (poly-Si). The polysilicon constituting the gate electrode 22 may be an intrinsic semiconductor including no impurities or an impurity semiconductor including n-type or p-type impurities.

[Method of Manufacturing Light-Receiving Element]

The light-receiving element constituting the unit pixel P can be manufactured, for example, as follows. First, the n-type electrically-conductive layer 12 is formed on the back surface S2 of the semiconductor substrate 11 using an ion implantation technique. Subsequently, a mask is formed on a predetermined region of the front surface S1 of the semiconductor substrate 11, and then p-type impurities (e.g., boron (B)) are doped using an ion implantation technique to form the p-type impurity diffusion layer (barrier layer 18). Next, n-type impurities (e.g., phosphorus (P)) are doped to form the n-type impurity diffusion layer (embedded layer 17). Subsequently, a mask is formed on a predetermined region of the front surface S1 of the semiconductor substrate 11, and then p-type impurities (e.g., boron (B)) are doped using an ion implantation technique to form the anode 13A, the drain 13B, and the guard ring 13C. Subsequently, in the same manner, a mask is formed on a predetermined region of the front surface S1 of the semiconductor substrate 11, and then n-type impurities (e.g., phosphorus (P)) or p-type impurities (e.g., boron (B) are doped using an ion implantation technique to sequentially form the n-type electrically-conductive regions 14B and 14C, and the LDD 13G1 and the LDD 13G2. Next, an insulating film (gate insulating film) is formed as the insulating layer 21 on the front surface S1 of the semiconductor substrate 11 using a CVD (Chemical Vapor Deposition) method, for example. Next, a polysilicon film is formed on the gate insulating film using a CVD method, for example, and then the polysilicon film is patterned using a photolithography method, for example, to form the gate electrode 22 between the anode 13A and the drain 13B. Thereafter, the insulating layer 21 as an interlayer insulating layer and one or a plurality of wiring layers are sequentially formed. This completes the light-receiving element illustrated in FIG. 1.

[Configuration of Peripheral Region]

As illustrated in FIG. 2, the peripheral region 110B is provided with the high-voltage guard ring 13D in a ring shape around the light-receiving region 110A. Outside the high-voltage guard ring 13D, the cathode 14A is provided in a ring shape around the light-receiving region 110A, in the same manner as the high-voltage guard ring 13D. Inside the high-voltage guard ring 13D, the CCR 13E is provided in a ring shape around the light-receiving region 110A, in the same manner as the high-voltage guard ring 13D. Further, inside the high-voltage guard ring 13D, specifically, between the light-receiving region 110A and the CCR 13E, the pixel edge guard ring 13F is provided in a ring shape around the light-receiving region 110A, in the same manner as the high-voltage guard ring 13D.

The high-voltage guard ring 13D is a p-type impurity region including p-type impurities at a concentration of $1e^{18}$ cm$^{-3}$ to $1e^{21}$ cm$^{-3}$, for example, and is provided to relax a high electric field formed at the front surface S1 of the semiconductor substrate 11 between the unit pixel P and the cathode 14A. The high-voltage guard ring 13D is in an electrically floating state, and a plurality of high-voltage guard rings 13D is formed along an outer shape of the light-receiving region 110A, for example, around the light-receiving region 110A. The high-voltage guard ring 13D is formed at a thickness of 0.1 μm to 3 μm, for example, from the interface of the front surface S1 of the semiconductor substrate 11.

The CCR 13E is a p-type impurity region including p-type impurities at a concentration of $1e^{18}$ cm$^{-3}$ to $1e^{21}$ cm$^{3}$, for example, and corresponds to a specific example of a "fifth first electrically-conductive region" of the present disclosure. The CCR 13E is provided to prevent a dark current, which has been generated in a region from the high-voltage guard ring 13D to the cathode 14A, for example, between the front surface S1 and a back surface 11S2 of the semiconductor substrate 11, from flowing into the light-receiving region 110A. The CCR 13E is coupled to the GND 33, for example, and a fixed electric potential (0 V) is applied thereto. A linewidth of a ring constituting the CCR 13E is 3 μm or more, for example; as for a thickness, the CCR 13E is formed at 0.1 μm to 3 μm, for example, from the interface of the front surface S1 of the semiconductor substrate 11, for example.

The pixel edge guard ring 13F is a p-type impurity region including p-type impurities at a concentration of $1e^{18}$ cm$^{-3}$ to $1e^{21}$ cm$^{-3}$, for example, and corresponds to a specific example of a "fourth first electrically-conductive region" of the present disclosure. The pixel edge guard ring 13F is provided to form an electric potential between the light-receiving region 110A and the CCR 13E to be a mirror image of an electric potential between a boundary of the unit pixel P and the anode 13A. In the same manner as the high-voltage guard ring 13D, the pixel edge guard ring 13F is in an electrically floating state, and a plurality of pixel edge guard rings 13F is formed along the outer shape of the light-receiving region 110A, for example, around the light-receiving region 110A. A linewidth of a ring constituting the pixel edge guard ring 13F is 0.2 μm to 10 μm, for example; as for a thickness, the pixel edge guard ring 13F is formed at 0.1 μm to 3 μm, for example, from the interface of the front surface S1 of the semiconductor substrate 11, for example.

The cathode 14A is an n-type impurity region including n-type impurities at a concentration of $1e^{18}$ cm$^{-3}$ to $1e^{21}$ cm$^{-3}$, for example, and is provided on the outermost periphery of the peripheral region 110B, for example, to surround the periphery of the light-receiving region 110A. The cathode 14A is coupled to the VDD 34 to apply, to the n-type electrically-conductive layer 12, a voltage for discharging electrons (e$^-$), for example, among carriers generated by photoelectric conversion. A linewidth of a ring constituting the cathode 14A is 10 μm or more, for example; as for a thickness, the cathode 14A is formed at 0.1 μm to 3 μm, for example, from the interface of the front surface S1 of the semiconductor substrate 11, for example.

Further, a p-type electrically-conductive region 15 having a lower impurity concentration, for example, may be provided around the p-type electrically-conductive region 13 constituting the high-voltage guard ring 13D and the CCR 13E. As for the impurity concentration, the p-type electrically-conductive region 15 is formed at a low concentration of $1e^{15}$ cm$^{-3}$ to $1e^{18}$ cm$^{-3}$, for example. Furthermore, although not illustrated, an n-type electrically-conductive region including n-type impurities at a concentration of $1e^{16}$ cm$^{-3}$ to $1e^{19}$ cm$^{-3}$, for example, may be formed near the interface of the front surface S1 of the semiconductor substrate 11 between the high-voltage guard rings 13D, for example.

In the light-receiving device 1 of the present embodiment, locations near a boundary between the light-receiving region 110A and the peripheral region 110B basically have a mirror symmetry. Specifically, the layout of the n-type and p-type impurity regions formed at the interface of the front surface S1 of the semiconductor substrate 11 on a side of the peripheral region 110B from the anode 13A of the unit pixel P arranged on the outermost periphery of the light-receiving region 110A, and the layout of the n-type and p-type impurity regions formed at the interface of the front surface S1 of the semiconductor substrate 11 inside the CCR 13E (on a side of the light-receiving region 110A), etc., have a mirror symmetry.

For example, an n-type electrically-conductive region 16 is provided in a ring shape to surround the light-receiving region 110A at the interface of the front surface S1 of the semiconductor substrate 11 at the boundary between the light-receiving region 110A and the peripheral region 110B. With the n-type electrically-conductive region 16 as a symmetrical axis, pixel edge guard rings 13F1, 13F2, and 13F3 are provided in the peripheral region 110B, in the same manner as the guard rings 13C1, 13C2, and 13C3 provided in the light-receiving region 110A. Further, the n-type electrically-conductive region 14C provided between the drain 13B and the guard ring 13C1 in the light-receiving region 110A and between the pixel edge guard rings 13F1, 13F2, and 13F3 adjacent to each other is also provided between the pixel edge guard rings 13F1, 13F2, and 13F3 adjacent to each other and between the pixel edge guard ring 13F and the CCR 13E in the peripheral region 110B. Further, in a cross-sectional view, the embedded layer 17 provided in the unit pixel P on the outermost periphery in the light-receiving region 110A extends to below the pixel edge guard ring 13F. This allows electric potentials of the guard rings 13C1, 13C2, and 13C3 of the unit pixel P arranged on the outermost periphery of the light-receiving region 110 to be equal to electric potentials of the guard rings 13C1, 13C2, and 13C3 of the unit pixel P arranged inside the light-receiving region 110.

It is to be noted that, unlike the embedded layer 17, the barrier layer 18 is preferably formed up to the edge of the light-receiving region 110A, instead of being formed below the pixel edge guard ring 13F. In a case where the barrier layer 18 is extended to below the pixel edge guard ring 13F, an electric potential of the semiconductor substrate 11 in the peripheral region 110B does not increase until the barrier layer 18 is depleted, thus leading to a possibility that a characteristic difference may occur in the chip. In contrast, as in the present embodiment, providing a region where the barrier layer 18 is not formed below the embedded layer 17 in the peripheral region 110B allows the embedded layer 17 to undergo potential propagation by following an electric potential of the semiconductor substrate 11. This makes it possible to continuously increase an electric potential of the front surface S1 of the semiconductor substrate 11 without causing breakdown of a p-n junction between the embedded layer 17 and the barrier layer 18.

Workings and Effects

In the light-receiving device 1 of the present embodiment, the pixel edge guard ring 13F in an electrically floating state is provided around the light-receiving region 110A in which a plurality of unit pixels P each having a light-receiving element are arranged two-dimensionally in matrix, and the embedded layer 17 is extended to below the pixel edge guard ring 13F. This enables an electric potential around the light-receiving region 110A to be formed so as to be a mirror image of an electric potential between a boundary of the unit pixel P and the anode 13A. This reduces fluctuation in a potential of the unit pixel P arranged on the outermost periphery of the light-receiving region 110A. This is described below.

A silicon-direct-conversion type X-ray sensor collects, in a depletion layer, electrons and holes generated by photoelectric conversion. In a typical visible light sensor, a power-supply voltage of 3 V, 5 V, or the like is applied to form a depletion layer in a silicon substrate up to a depth of several μm. In contrast, in the X-ray sensor, for example, a power-supply voltage of 300 C, 500 V, or the like is applied to deplete a silicon substrate up to a depth of 650 μm, depending on a wavelength of the X-ray. Applying such a high voltage to a silicon substrate causes electric field intensity to be locally higher in some cases; when exceeding a certain electric field, breakdown occurs.

As a method for preventing the breakdown from occurring, an X-ray sensor provided with a high-voltage guard ring has been proposed. The high-voltage guard ring arranges several impurity diffusion layers in an electrically floating state around a pixel and distributes application voltages to thereby relax the electric field intensity. Further, an X-ray sensor has been proposed that is provided, between a high-voltage guard ring and a pixel array section, with a CCR that collects a dark current generated at the high-voltage guard ring, in order for that dark current generated at the high-voltage guard ring not to flow into the pixel.

Figure 4:
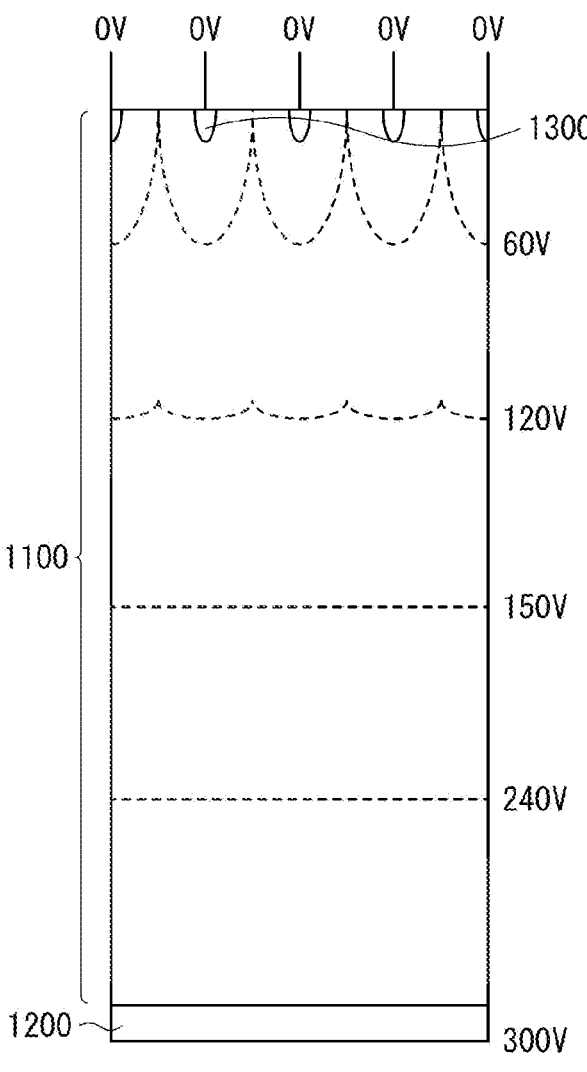
FIG. 4 is a conceptual diagram of a potential at a peripheral edge of a light-receiving region of a typical X-ray imaging device.

Incidentally, for example, as illustrated in FIG. 4, when applying a power-supply voltage of 300 V, for example, to a cathode 1200 in order to deplete a silicon substrate in the silicon-direct-conversion type X-ray sensor, a potential of several tens of V is formed at the end of a pixel (an anode 1300) set to 0 V (GND), for example. In general, the CCR is set to 0 V (GND); therefore, in a case where a structure is not created that controls a potential of the silicon substrate between the end of the pixel array section and the CCR, a potential of a pixel arranged on the outermost periphery is influenced by an electric potential of the CCR to be a potential different from a desired potential. This causes issues such as fluctuation in characteristics of the pixel arranged on the outermost periphery, specifically, transmission failure in signal charge, deterioration in a charge loss rate, and an increase in a leak current.

Meanwhile, in the present embodiment, the p-type electrically-conductive region 13 having a specular relationship, for example, in a plan view is provided at a boundary position between the light-receiving region 110A and the peripheral region 110B. Specifically, the pixel edge guard ring 13F in an electrically floating state is provided around the light-receiving region 110A to have a mirror symmetry with respect to the guard ring 13C of the unit pixel P arranged on the outermost periphery of the light-receiving region 110A. This allow an electric potential of the front surface S1 of the semiconductor substrate 11 to also have a specular relationship, thus allowing an electric potential of the unit pixel P arranged on the outermost periphery to be equivalent to an electric potential of the unit pixel P arranged inside. This reduces dispersion of pixel characteristics between the unit pixel P arranged on the outermost periphery and the unit pixel P arranged inside, e.g., characteristics such as transfer of signal charge, a collection rate, and a leak current.

Further, in the present embodiment, the embedded layer 17 provided at a position facing the drain 13B and the guard ring 13C of the light-receiving region 110A also has a specular relationship, thus allowing the electric potential of the front surface S1 of the unit pixel P arranged on the outermost periphery to be equivalent to the electric potential of the front surface S1 of the unit pixel P arranged inside.

As described above, it is possible, in the light-receiving device 1 of the present embodiment, to prevent degradation in pixel characteristics of the unit pixel P arranged on the outermost periphery of the light-receiving region 110A as well as to reduce dispersion of the pixel characteristics in the light-receiving region 110A.

Next, descriptions are given of Modification Examples 1 to 7 and an application example of the present disclosure. Hereinafter, components similar to those of the foregoing embodiment are denoted by the same reference numerals, and descriptions thereof are omitted as appropriate.

2. Modification Examples

2-1. Modification Example 1

Figure 5:
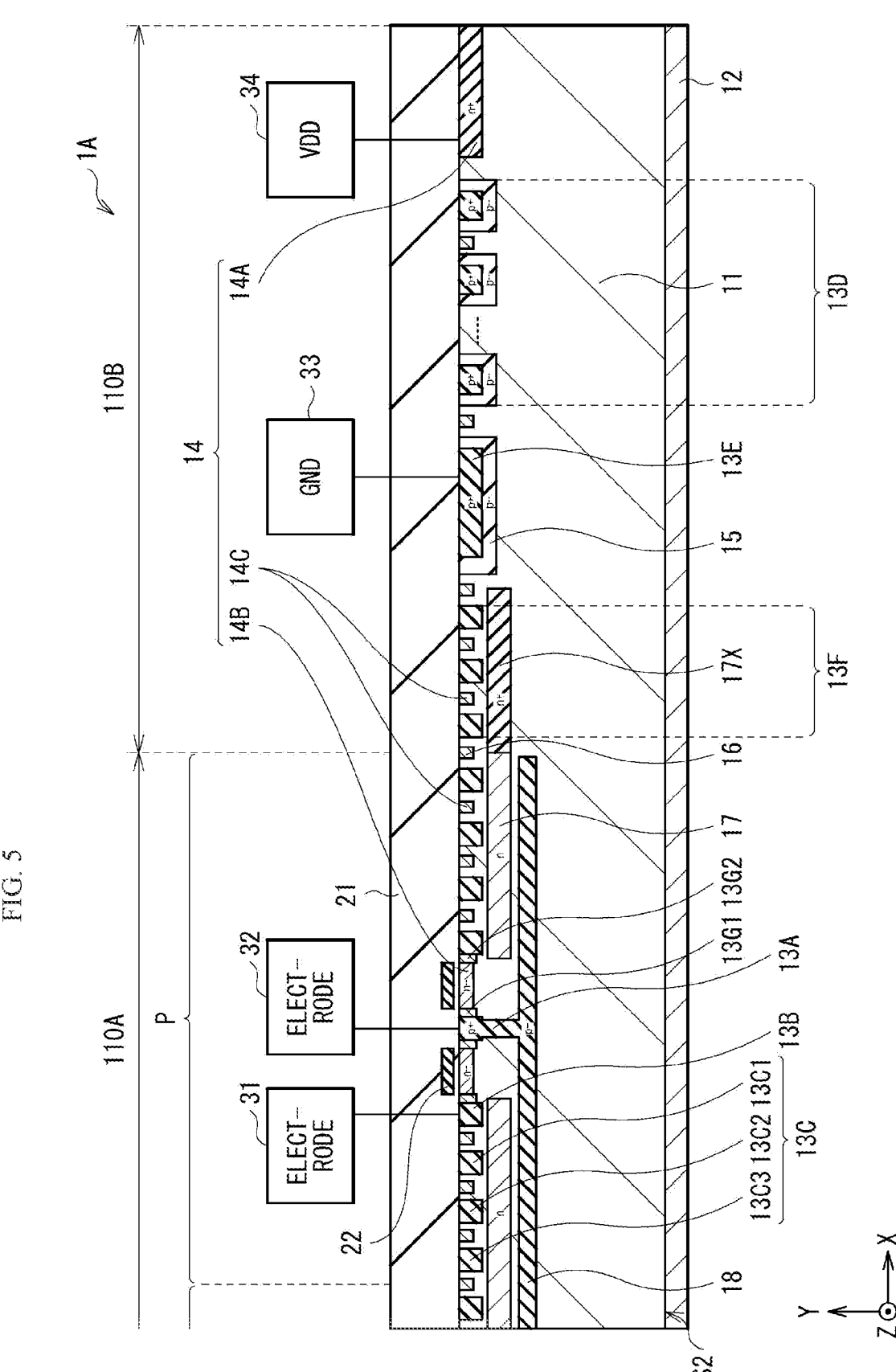
FIG. 5 is a schematic cross-sectional view of an example of a configuration of a light-receiving device according to Modification Example 1 of the present disclosure.

FIG. 5 schematically illustrates an example of a cross-sectional configuration of a light-receiving device (a light-receiving device 1A) according to Modification Example 1 of the present disclosure. In the same manner as the foregoing embodiment, the light-receiving device 1A includes, for example, a PIN type photodiode that applies a reverse bias between the front surface and the back surface of the semiconductor substrate 11. The light-receiving device 1A constitutes one pixel (unit pixel P) in an electromagnetic wave detector or a radiation imaging element (e.g., X-ray imaging device 100) to read information on a subject (to capture an image of a subject) on the basis of a radioactive ray (e.g., α-ray, β-ray, γ-ray, and X-ray, etc.). The light-receiving device 1A of the present modification example differs from the foregoing embodiment in that an impurity concentration of an embedded layer 17X formed below the pixel edge guard ring 13F is set higher in concentration than the embedded layer 17 provided in the light-receiving region 110A.

In a case where an impurity concentration of the embedded layer 17 is set to be the same between a location below the drain 13B and the guard ring 13C and a location below the pixel edge guard ring 13F, a difference may sometimes occur in the spread of a depletion layer due to a difference in areas between the anode 13A and the CCR 13E to both of which a fixed electric potential of 0 V, for example, is applied. For example, the CCR 13E typically has a larger area than the anode 13A. For this reason, a depletion layer is more likely to spread on a side of the CCR 13E than a side of the anode 13A, thus causing a potential difference to occur between the pixel edge guard ring 13F and the guard ring 13C where an electric potential is increased due to depletion of the embedded layer 17. This leads to degradation in voltage withstanding.

Figure 6:
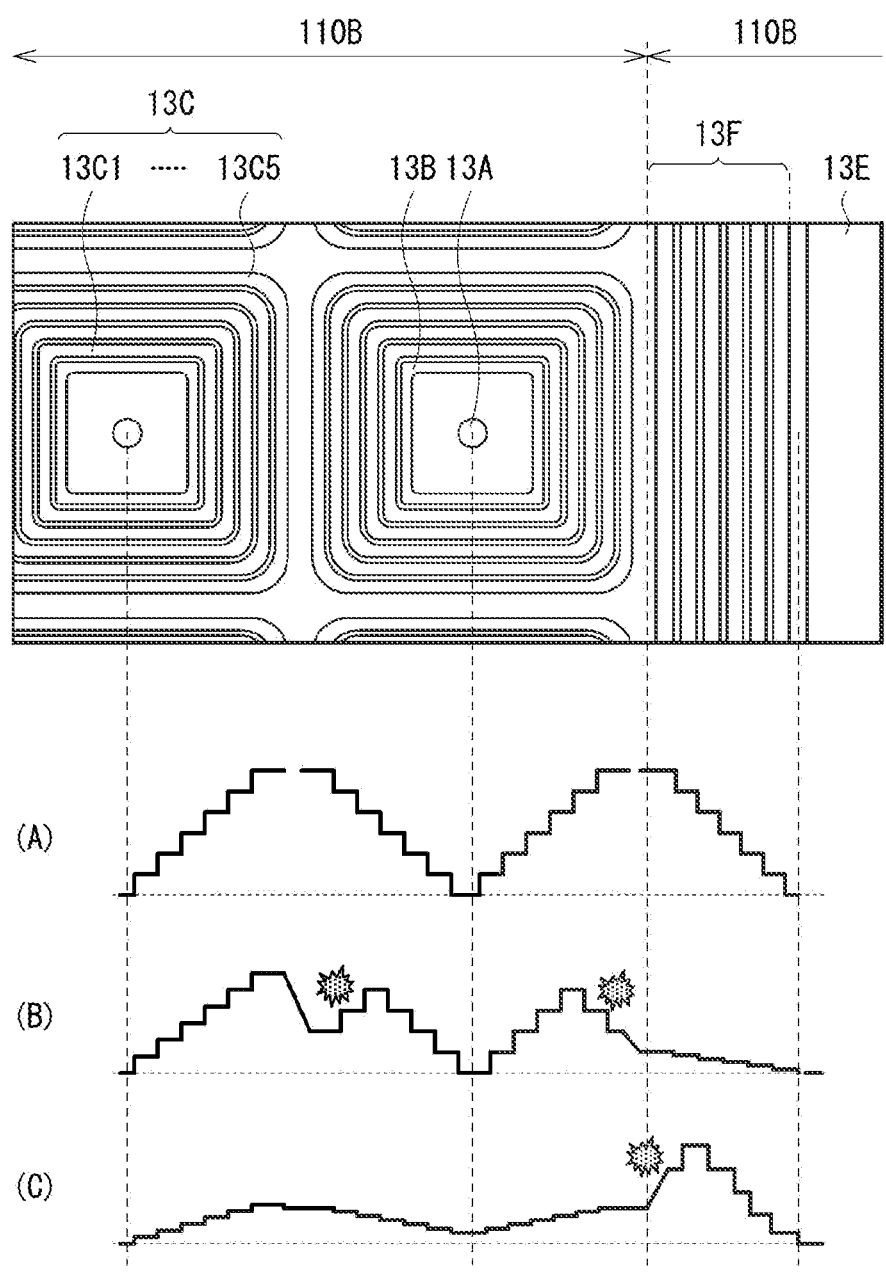
FIG. 6 is a diagram illustrating a potential of a front surface of a semiconductor substrate near a boundary between a light-receiving region and a peripheral region on each condition.

For example, as illustrated in FIG. 6, there is no issue in a case (A) where a potential of the guard ring 13C of the unit pixel P arranged on the outermost periphery of the light-receiving region 110A and a potential of the pixel edge guard ring 13F are equal to each other. However, in a case (B) where the potential of the guard ring 13C of the unit pixel P arranged on the outermost periphery of the light-receiving region 110A is higher than the potential of the pixel edge guard ring 13F, there is a possibility that a high electric field region may be generated on a side of the guard ring 13C, thus causing breakdown to occur. Meanwhile, in a case (C) where the potential of the guard ring 13C of the unit pixel P arranged on the outermost periphery of the light-receiving region 110A is lower than the potential of the pixel edge guard ring 13F, there is a possibility that a high electric field region may be generated on a side of the pixel edge guard ring 13F, thus causing breakdown to occur.

In contrast, in the present modification example, an impurity concentration of the n-type impurity diffusion layer constituting the embedded layer 17X formed below the pixel edge guard ring 13F is set to be a concentration (e.g., $2e^{14}$ $cm^{-3}$ to $2e^{17}$ $cm^{-3}$) higher than that of the embedded layer 17 provided in the light-receiving region 110A. This allows the spread of a depletion layer in the embedded layer 17 provided in the light-receiving region 110A and the spread of a depletion layer in the embedded layer 17X provided below the pixel edge guard ring 13F to align with each other. It is therefore possible to prevent degradation in voltage withstanding resulting from the potential difference between the pixel edge guard ring 13F and the guard ring 13C on the outermost periphery of the light-receiving region 110A.

2-2. Modification Example 2

Figure 7:
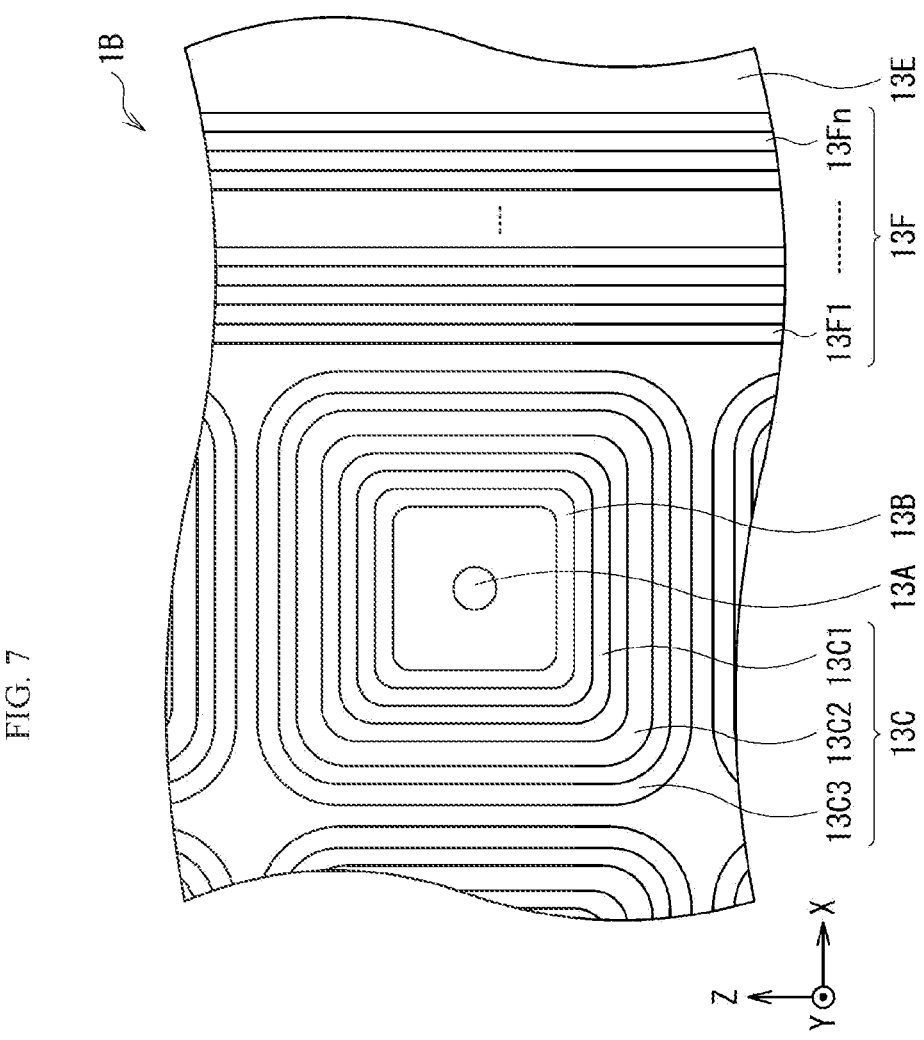
FIG. 7 is a schematic plan view of an example of a configuration of a light-receiving device according to Modification Example 2 of the present disclosure.

FIG. 7 schematically illustrates an example of a planar configuration of a light-receiving device (a light-receiving device 1B) according to Modification Example 2 of the present disclosure. The foregoing embodiment exemplifies the case where the same number of pixel edge guard rings 13F as the guard rings 13C are provided. However, more pixel edge guard rings 13F (pixel edge guard rings 13F1, . . . 13Fn) than the guard rings 13C may be provided. This allows the electric potential of the front surface S1 of the semiconductor substrate 11 at the pixel edge guard ring 13F to easily increase, thus making it possible to reduce the above-described occurrence of the potential difference between the guard ring 13C and the pixel edge guard ring 13F due to the difference in the areas between the anode 13A and the CCR 13E.

2-3. Modification Example 3

Figure 8:
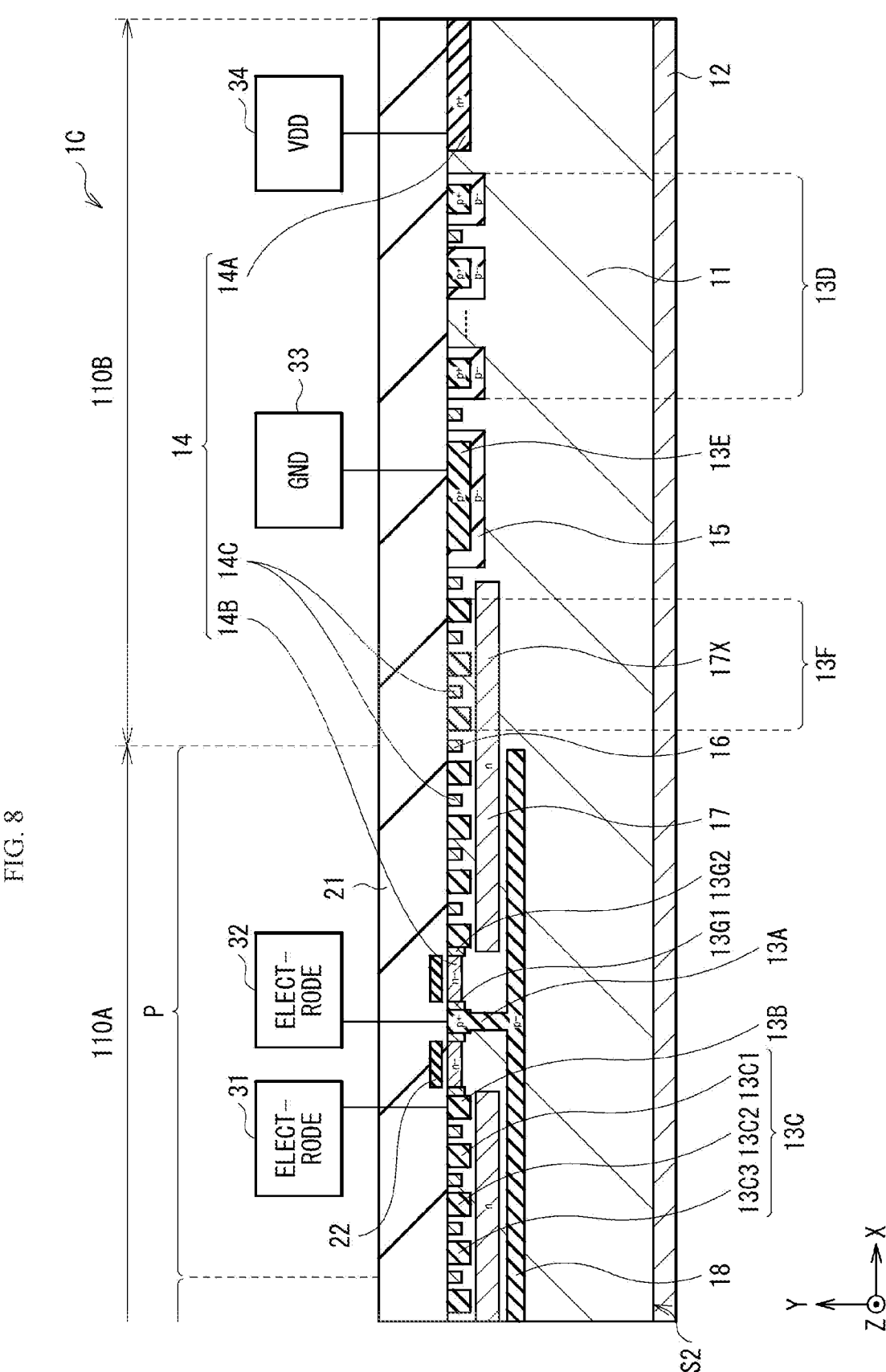
FIG. 8 is a schematic cross-sectional view of an example of a configuration of a light-receiving device according to Modification Example 3 of the present disclosure.

FIG. 8 schematically illustrates an example of a cross-sectional configuration of a light-receiving device (a light-receiving device 1C) according to Modification Example 3 of the present disclosure. In the foregoing embodiment, the n-type electrically-conductive region 14C is provided between the drain 13B and the guard ring 13C1, between the guard rings 13C1, 13C2, and 13C3 adjacent to each other, between the pixel edge guard rings 13F1, 13F2, and 13F3 adjacent to each other, and between the pixel edge guard ring 13F3 and the CCR 13E. However, an n-type electrically-conductive region 14D having a concentration higher than that of the n-type electrically-conductive region 14C may be provided between the pixel edge guard rings 13F1, 13F2, and 13F3 adjacent to each other and between the pixel edge guard ring 13F3 and the CCR 13E. This allows the potential of the front surface S1 of the semiconductor substrate 11 at the pixel edge guard ring 13F to easily increase, thus making it possible to reduce the above-described occurrence of the potential difference between the guard ring 13C and the pixel edge guard ring 13F due to the difference in the areas between the anode 13A and the CCR 13E.

2-4. Modification Example 4

Figure 9A:
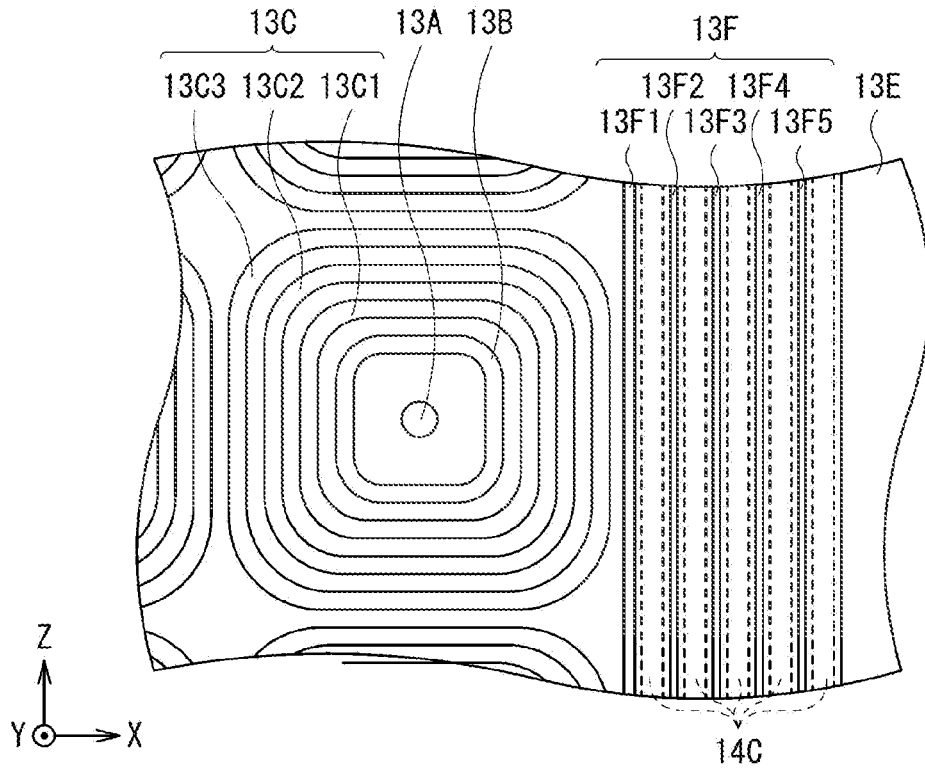
FIG. 9A is a schematic plan view of an example of a configuration of a light-receiving device according to Modification Example 4 of the present disclosure.
Figure 9B:
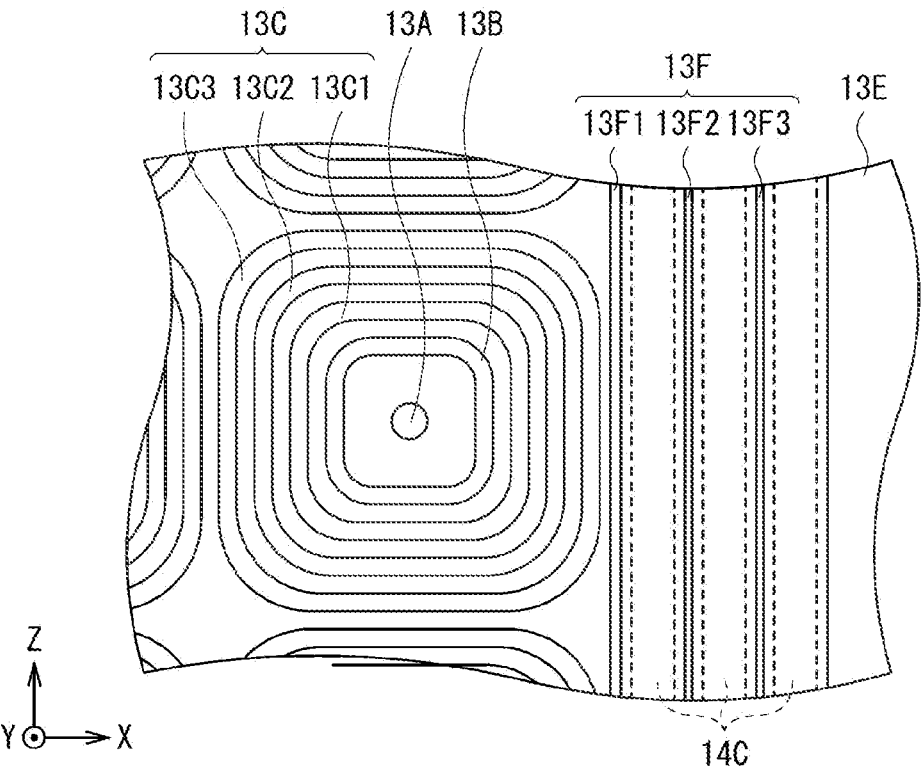
FIG. 9B is a schematic plan view of another example of the configuration of the light-receiving device according to Modification Example 4 of the present disclosure.

FIG. 9A schematically illustrates an example of a planar configuration of a light-receiving device (a light-receiving device 1D) according to Modification Example 4 of the present disclosure. FIG. 9B schematically illustrates another example of the planar configuration of the light-receiving device (light-receiving device 1D) according to Modification Example 4 of the present disclosure. The foregoing embodiment exemplifies the case where the pixel edge guard ring 13F is provided that has the same linewidth as the linewidth of the ring constituting the guard ring 13C; however, this is not limitative.

For example, as illustrated in FIG. 9A, each linewidth of the rings constituting the respective pixel edge guard rings 13F1, 13F2, 13F3, 13F4, and 13F5 may be narrower than that of the guard ring 13C, and a width of the n-type electrically-conductive region 14C provided therebetween may be widened to increase an area for formation of the n-type electrically-conductive region 14C. Further, as illustrated in FIG. 9B, the number of the pixel edge guard rings 13F may be reduced to further widen the width of the n-type electrically-conductive region 14C and thus to further increase the area for formation of the n-type electrically-conductive region 14C. This allows the potential of the front surface S1 of the semiconductor substrate 11 at the pixel edge guard ring 13F to further easily increase. It is therefore possible to further reduce the above-described occurrence of the potential difference between the guard ring 13C and the pixel edge guard ring 13F due to the difference in the areas between the anode 13A and the CCR 13E.

2-5. Modification Example 5

Figure 10:
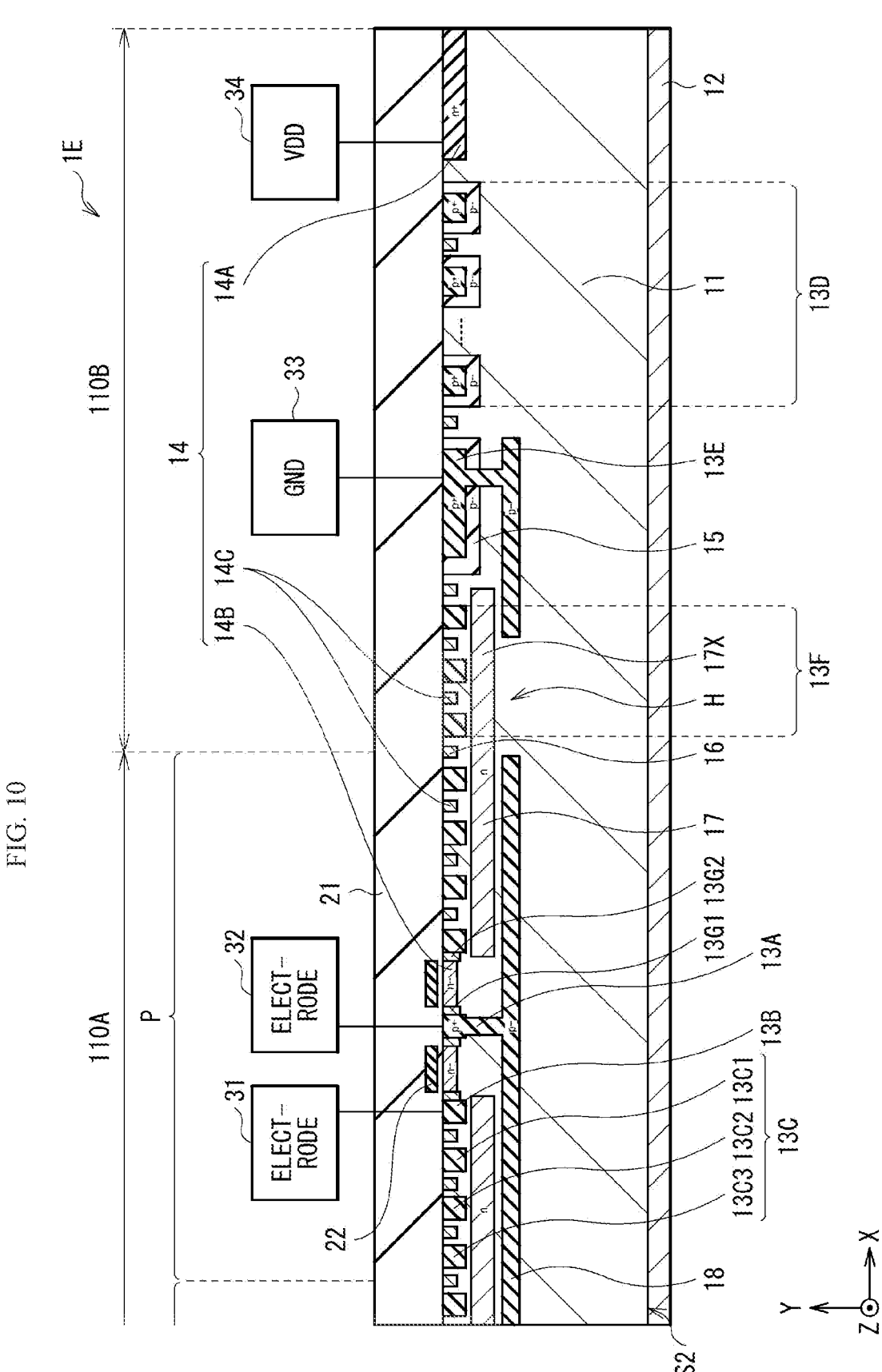
FIG. 10 is a schematic cross-sectional view of an example of a configuration of a light-receiving device according to Modification Example 5 of the present disclosure.
Figure 11:
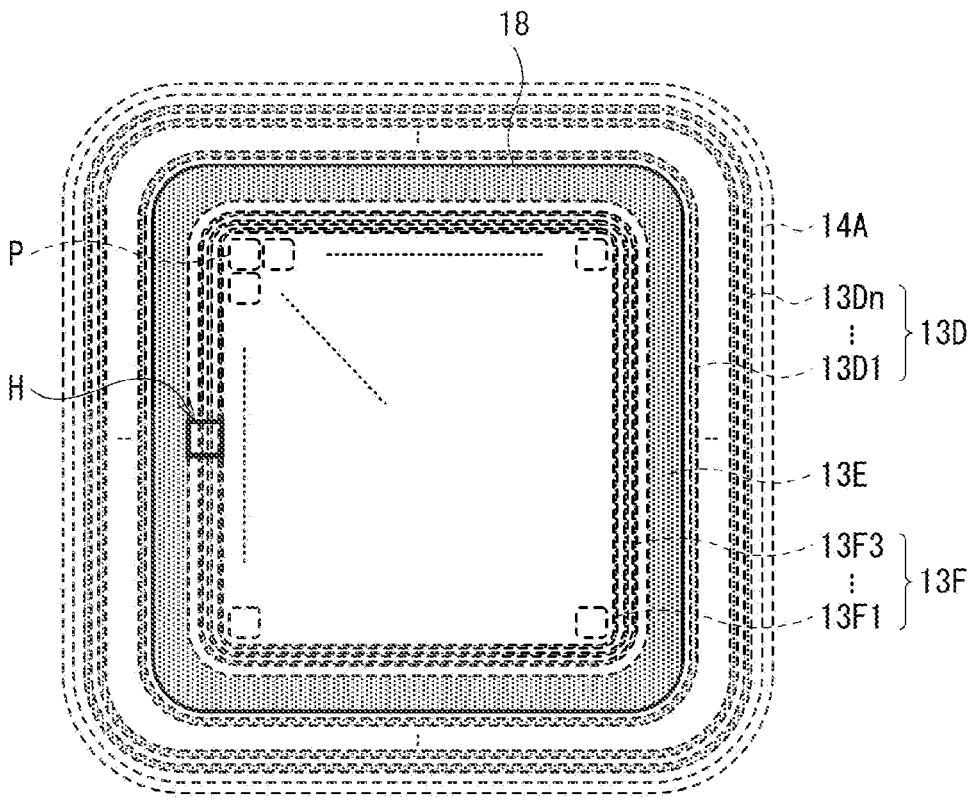
FIG. 11 is a schematic plan view of an overall configuration of the light-receiving device illustrated in FIG. 10.

FIG. 10 schematically illustrates an example of a cross-sectional configuration of a light-receiving device (a light-receiving device 1E) according to Modification Example 5 of the present disclosure. FIG. 11 schematically illustrates an example of a planar configuration of the entire light-receiving device 1E illustrated in FIG. 10. The foregoing embodiment exemplifies the formation of the barrier layer 18 only in the light-receiving region 110A, but this is not limitative.

Figure 12A:
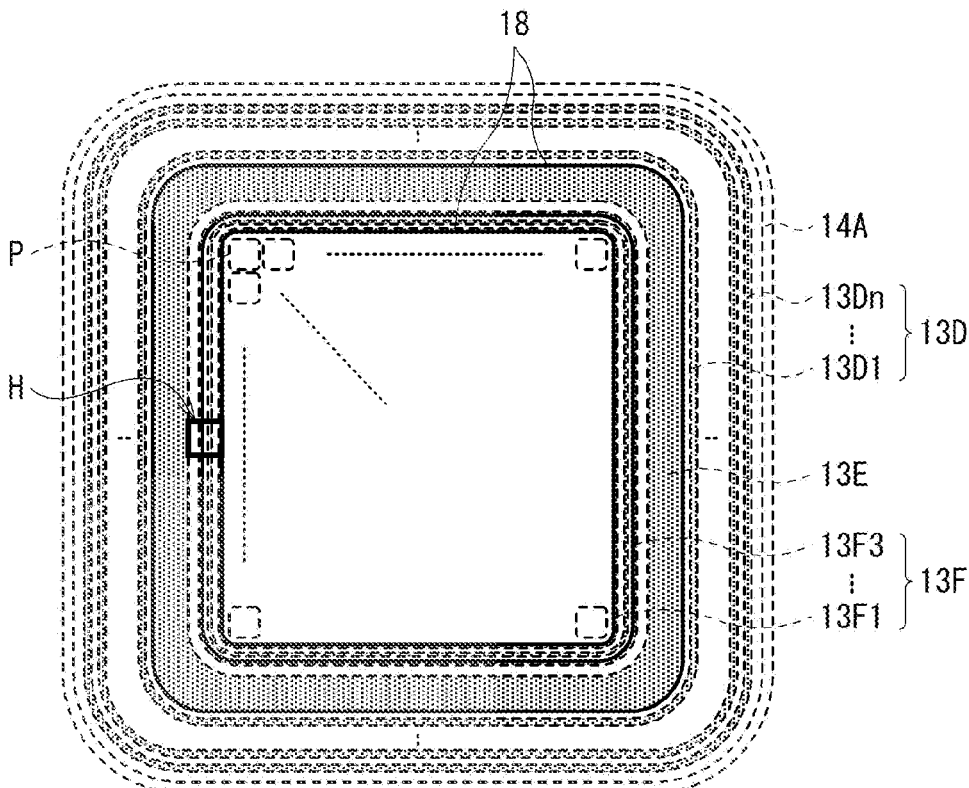
FIG. 12A is a schematic plan view of another example of the configuration of the light-receiving device according to Modification Example 5 of the present disclosure.

For example, as illustrated in FIGS. 10 and 11, the barrier layer 18 may be extended to below the CCR 13E, for example, to provide an opening H in a portion of a location below the pixel edge guard rings 13F1, 13F2, and 13F3. At that time, the CCR 13E may be protruded toward the back surface S2 to be coupled to the barrier layer 18. Alternatively, as illustrated in FIG. 12A, the barrier layer 18 may be separately provided below the CCR 13E.

Figure 12B:
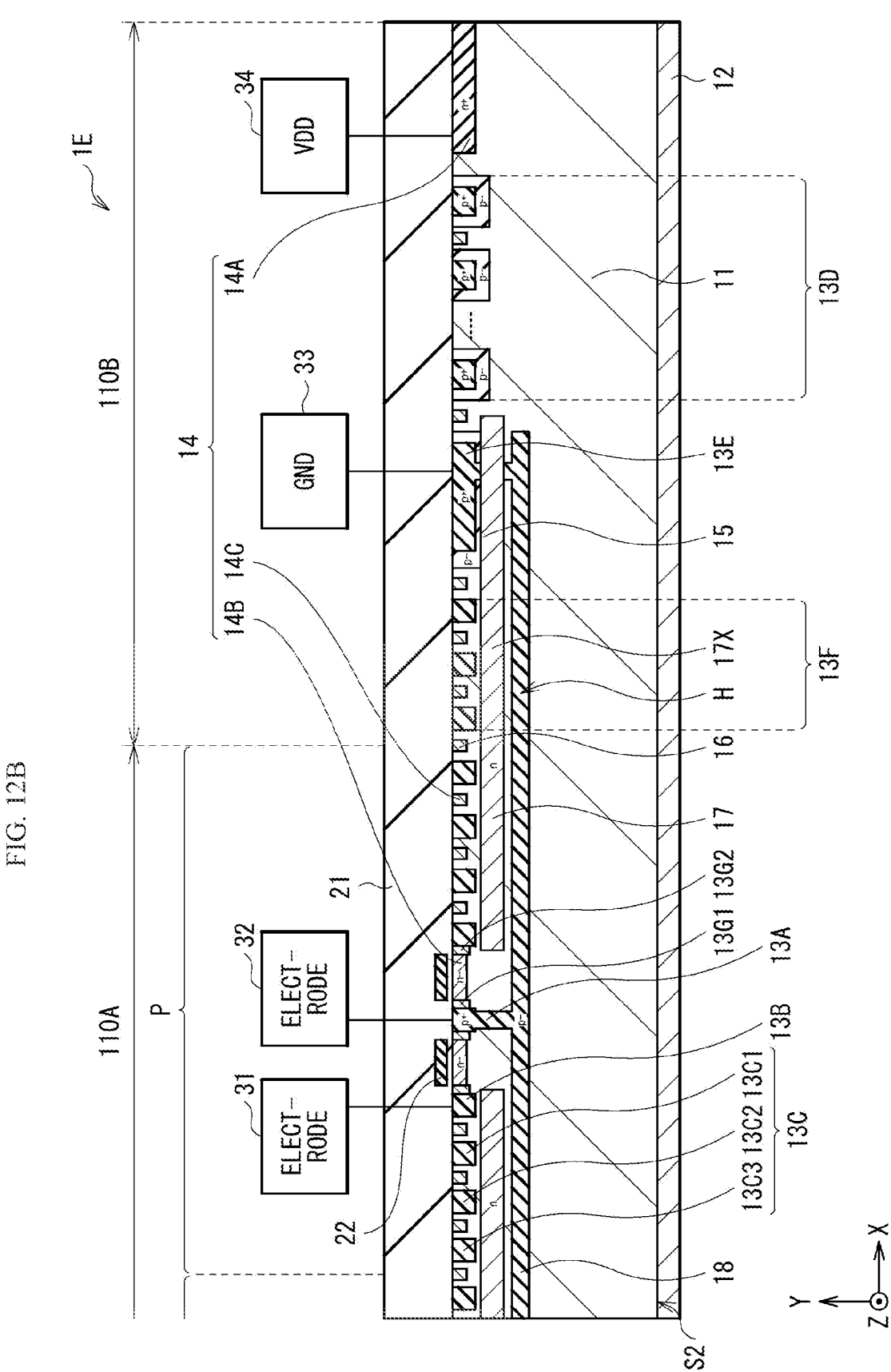
FIG. 12B is a schematic cross-sectional view of another example of the configuration of the light-receiving device according to Modification Example 5 of the present disclosure.
Figure 12C:
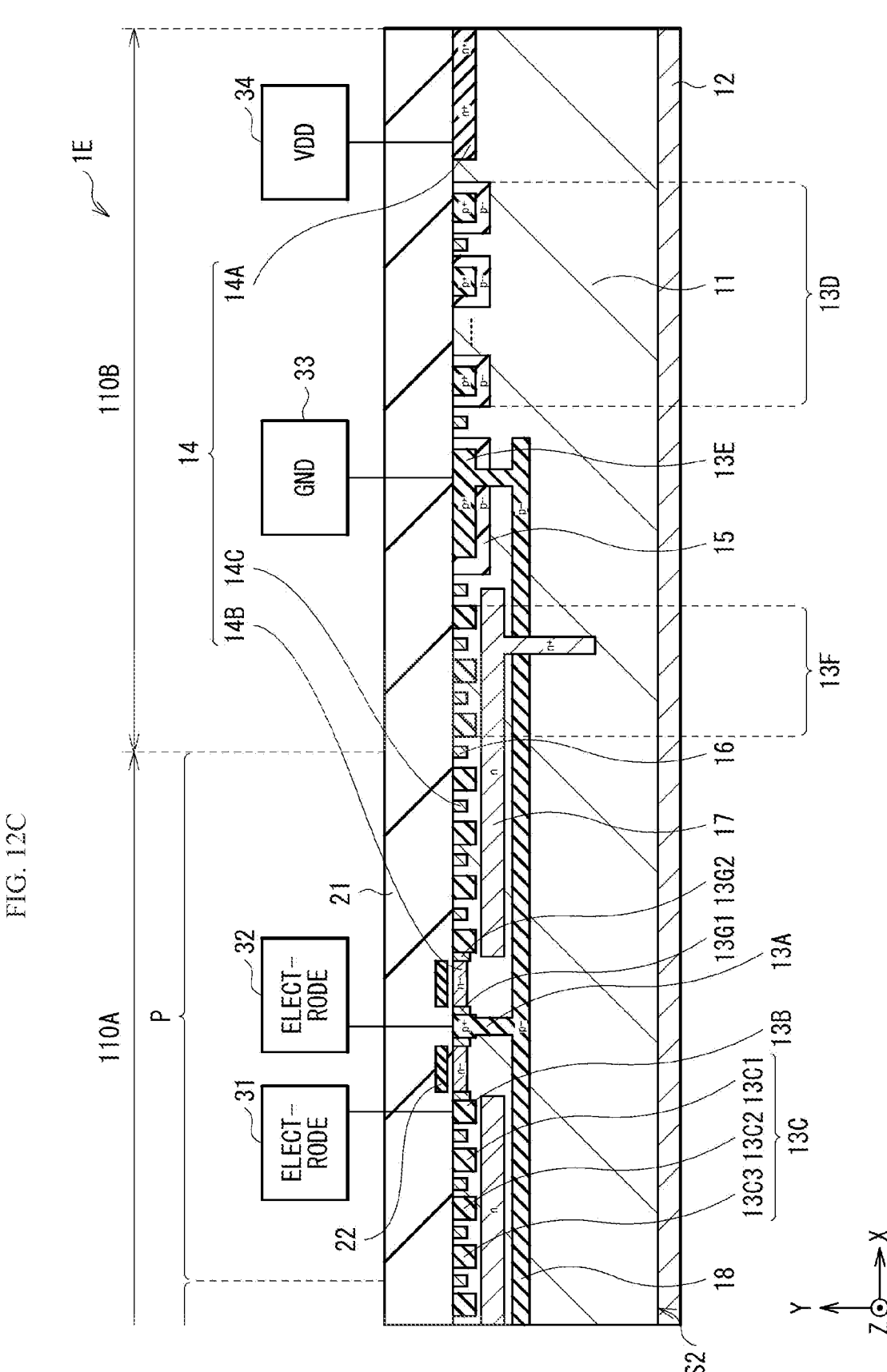
FIG. 12C is a schematic cross-sectional view of another example of the configuration of the light-receiving device according to Modification Example 5 of the present disclosure.

In addition, in a case where the barrier layer 18 is formed to extend to below the CCR 13E, for example, of the peripheral region 110B, the embedded layer 17 may be extended to the outside of the CCR 13E, for example, as illustrated in FIG. 12B. At that time, extending sections 13X extending from the CCR 13E to the side of the back surface S2 are provided in a dot shape, and the embedded layer 17 is extended to the outside of the CCR 13E through a gap between the extending sections 13X formed in the dot shape. Alternatively, as illustrated in FIG. 12C, the embedded layer 17 may be protruded closer to the back surface S2 than the barrier layer 18 at a location below the pixel edge guard rings 13F1, 13F2, and 13F3.

Thus, in the same manner as the foregoing embodiment, it is possible to continuously increase the electric potential of the front surface S1 of the semiconductor substrate 11 in association with an increase in the voltage of the VDD 34 without causing breakdown due to a reverse bias of the p-n junction between the embedded layer 17 and the barrier layer 18.

2-6. Modification Example 6

Figure 13:
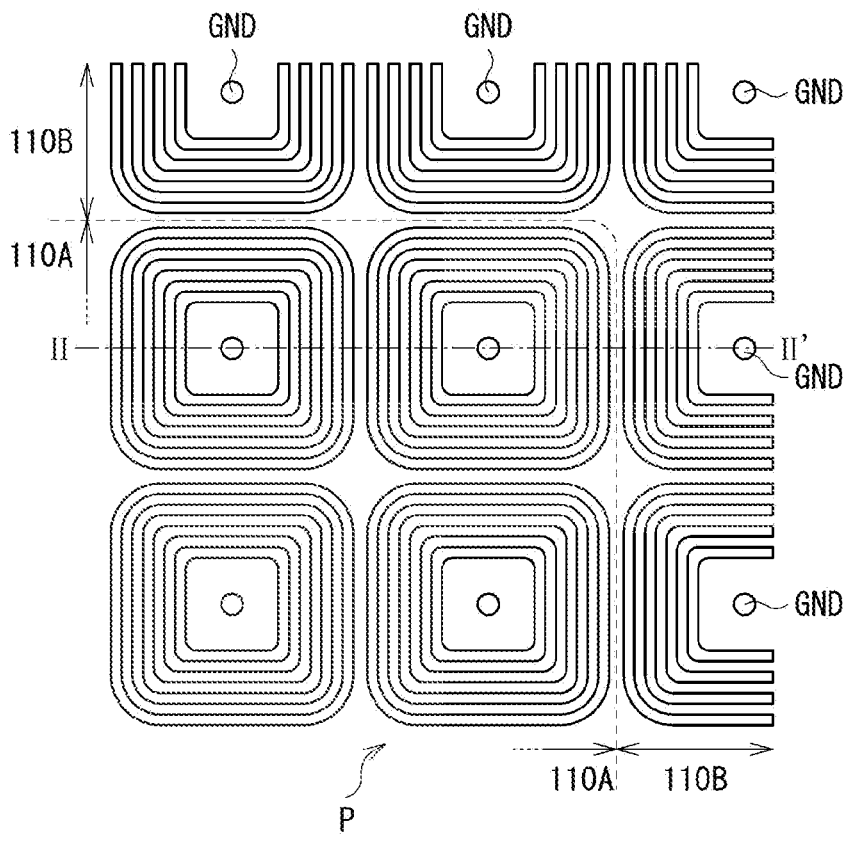
FIG. 13 is a schematic plan view of an example of a layout of a pixel edge guard ring of a light-receiving device according to Modification Example 6 of the present disclosure.
Figure 15:
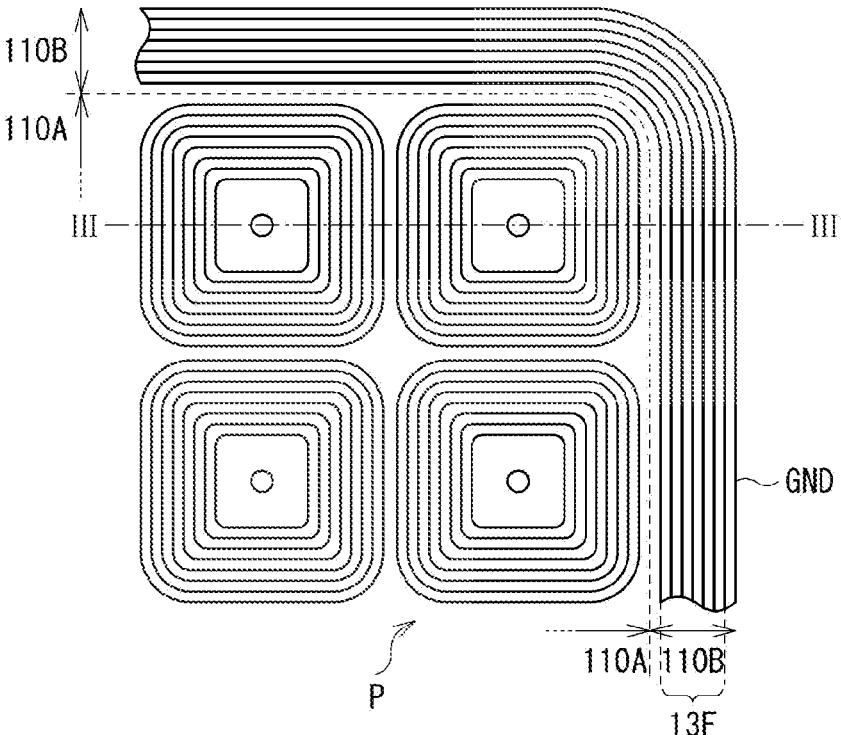
FIG. 15 is a schematic plan view of a layout of a pixel edge guard ring as a comparative example.

FIG. 13 schematically illustrates another example of a layout of the pixel edge guard ring 13F as a modification example of the light-receiving device 1 according to the foregoing embodiment. As illustrated in FIG. 15, the foregoing embodiment exemplifies the case where the plurality of ring-shaped pixel edge guard rings 13F1, 13F2, and 13F3 that are continuous along the outer shape of the light-receiving region 110A are provided around the light-receiving region 110A; however, this is not limitative. For example, as illustrated in FIG. 13, the pixel edge guard rings 13F1, 1F2, 13F3, and 13F4 having the same layout as the layout of the drain 13B, and the guard rings 13C1, 13C2, and 13C3 in the halved unit pixel P may be arranged line-symmetrically along a side of the unit pixel P.

Figure 16:
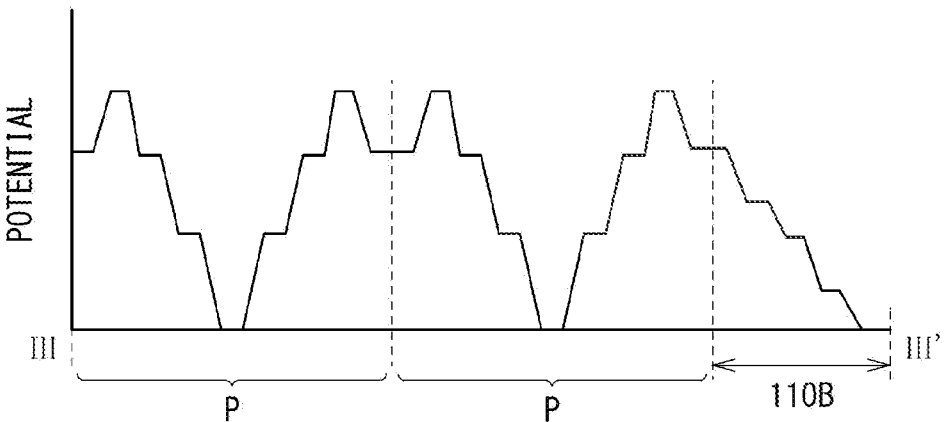
FIG. 16 is a diagram illustrating a potential of a front surface of a semiconductor substrate near a boundary between a light-receiving region and a peripheral region in a case of including the pixel edge guard ring illustrated in FIG. 15.

As illustrated in FIG. 15, in a case where the pixel edge guard ring 13F having a ring shape is provided continuously along the outer shape of the light-receiving region 110A around the light-receiving region 110A, a difference occurs in the spread of a depletion layer due to asymmetry of layouts between the guard ring 13C and the pixel edge guard ring 13F. As a result, as for a potential along a line III-III indicated in FIG. 15, for example, a potential with the pixel edge guard ring 13F may sometimes be lower than the potential of the guard ring 13C between the adjacent unit pixels P, as illustrated in FIG. 16.

Figure 14:
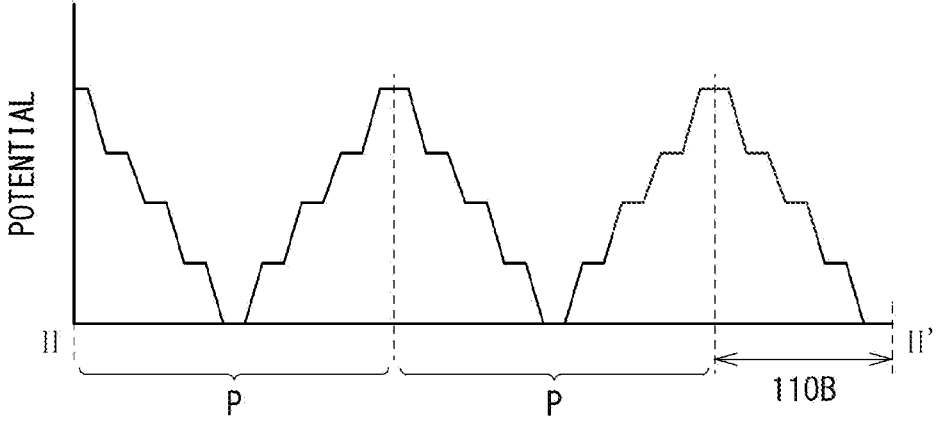
FIG. 14 is a diagram illustrating a potential of a front surface of a semiconductor substrate near a boundary between a light-receiving region and a peripheral region of the light-receiving device illustrated in FIG. 13.

In contrast, in the present modification example, the pixel edge guard rings 13F1, 1F2, 13F3, and 13F4 are provided. The pixel edge guard rings 13F1, 1F2, 13F3, and 13F4 are line-symmetrical along a side of the unit pixel P arranged on the outermost periphery of the light-receiving region 110A, and have the same layout as the layout of the drain 13B, and the guard rings 13C1, 13C2, and 13C3 in the halved unit pixel P. Thus, as for a potential along a line II-II indicated in FIG. 13, for example, the potential of the unit pixel P arranged on the outermost periphery and the potential of the adjacent pixel edge guard ring 13F are equivalent to each other, as illustrated in FIG. 14. It is therefore possible, in the light-receiving region 110A, to further uniform pixel characteristics of the unit pixel P arranged on the outermost periphery and the unit pixel P arranged inside.

Figure 17A:
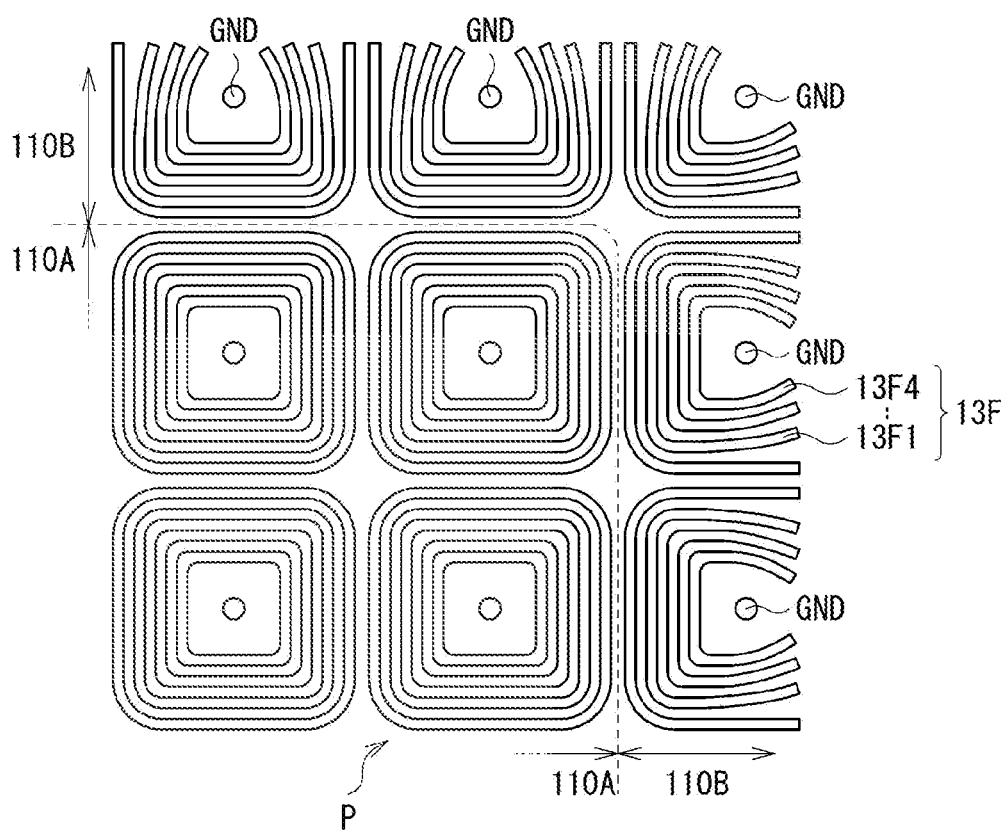
FIG. 17A is a schematic plan view of another example of the layout of the pixel edge guard ring of the light-receiving device according to Modification Example 6 of the present disclosure.
Figure 17B:
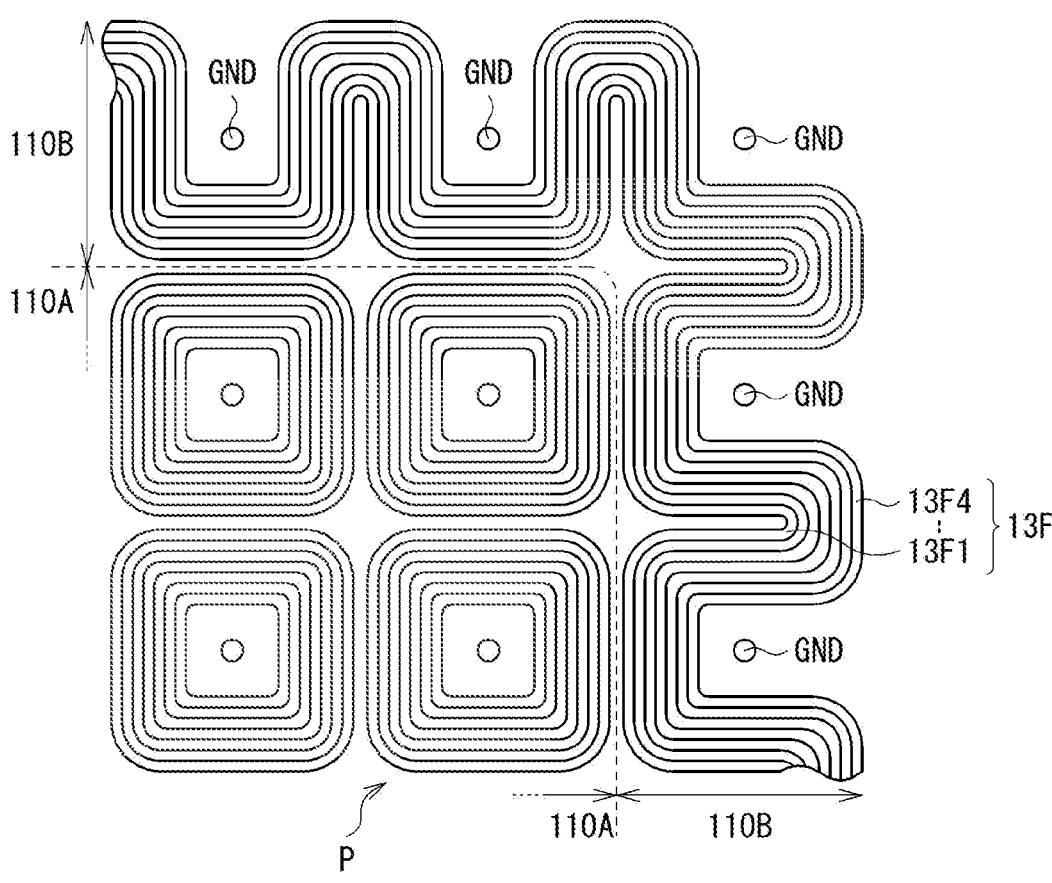
FIG. 17B is a schematic plan view of another example of the layout of the pixel edge guard ring of the light-receiving device according to Modification Example 6 of the present disclosure.

In addition, the layout of the pixel edge guard ring 13F may be as follows. For example, intervals between terminal parts of the respective pixel edge guard rings 13F1, 13F2, 13F3, and 13F4 provided along a side of each unit pixel P may be widened away from each other, as illustrated in FIG. 17A. This makes it possible to relax electric fields at terminal parts of the respective pixel edge guard rings 13F1, 13F2, 13F3, and 13F4. Alternatively, for example, as illustrated in FIG. 17B, the respective pixel edge guard rings 13F1, 13F2, 13F3, and 13F4 provided along sides of the unit pixels P may be coupled to each other to form the pixel edge guard ring 13F that is continuous in a meandering manner.

2-7. Modification Example 7

Further, the light-receiving device (e.g., light-receiving device 1) of the present disclosure may have the following configuration.

Figure 18:
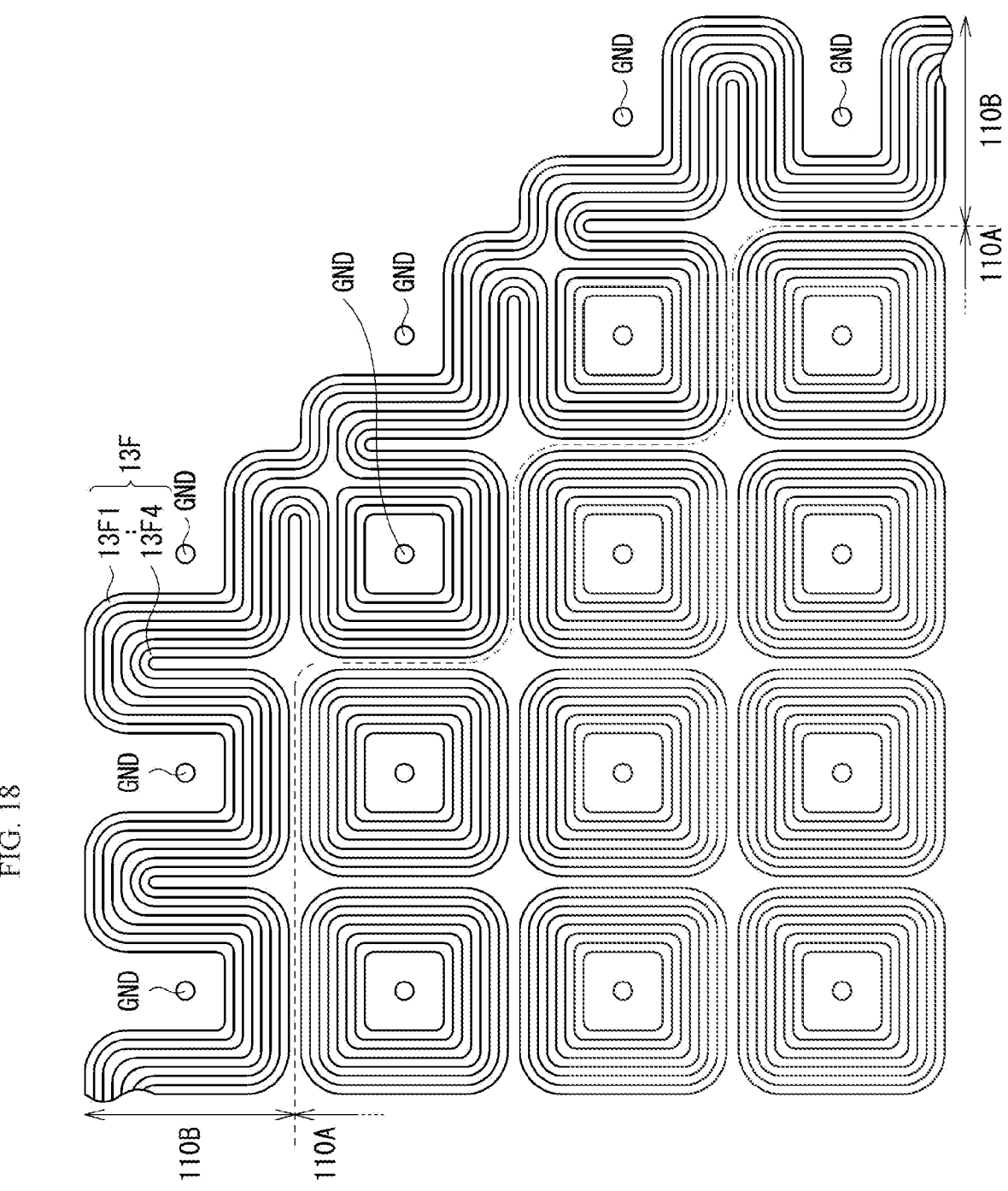
FIG. 18 is a schematic plan view of an example of a light-receiving device according to Modification Example 7 of the present disclosure.

For example, the foregoing embodiment and the like exemplify the plurality of unit pixels P being arranged in matrix and the light-receiving region 110A having a substantially rectangular shape; however, the shape of the light-receiving region 110A is not limited thereto. The plurality of unit pixels P can be arranged arbitrarily, and the shape of the light-receiving region 110A may be a polygonal shape other than the substantially rectangular shape, for example, as illustrated in FIG. 18.

Figure 19:
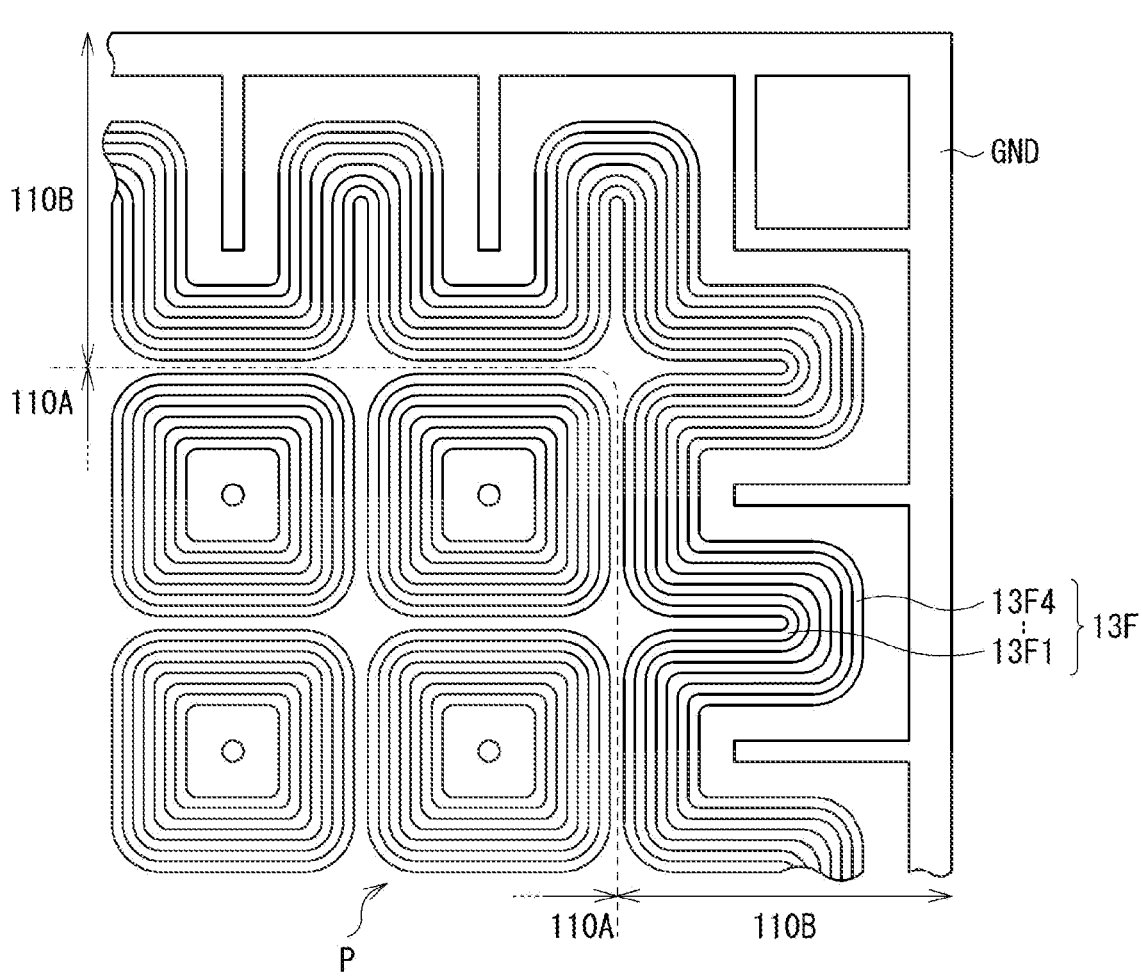
FIG. 19 is a schematic plan view of another embodiment of the light-receiving device according to Modification Example 7 of the present disclosure.

In addition, for example, Modification Example 6 exemplifies the case where a terminal of the GND is provided for each row and for each column in accordance with the plurality of unit pixels P arranged in matrix in the light-receiving region 110A; however, terminals of the respective GNDs may be coupled to each other, as illustrated in FIG. 19.

Figure 20:
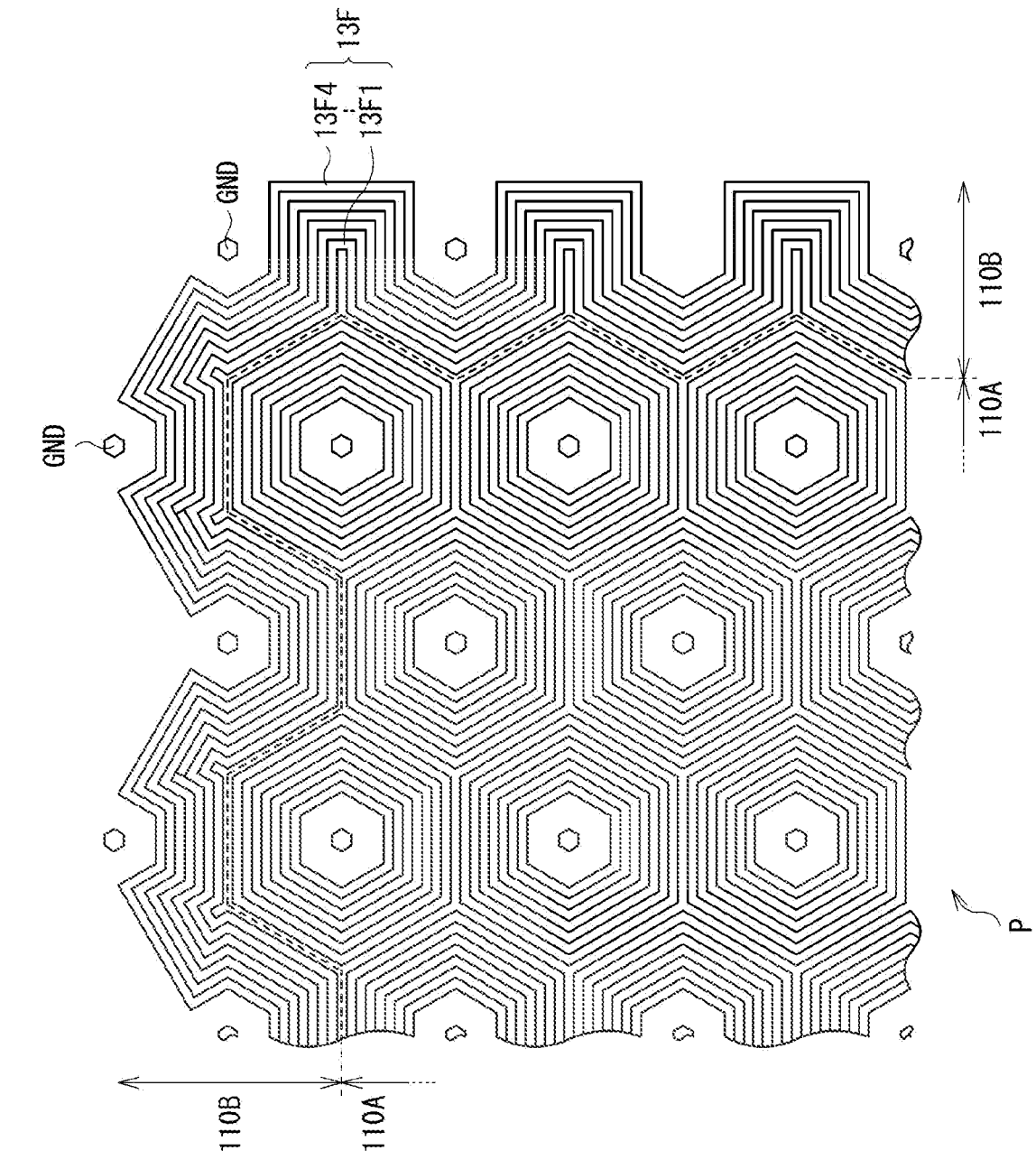
FIG. 20 is a schematic plan view of another embodiment of the light-receiving device according to Modification Example 7 of the present disclosure.

Further, the foregoing embodiment and the like exemplify the unit pixel P having a substantially rectangular shape, but the shape of the unit pixel P is not limited thereto; for example, as illustrated in FIG. 20, the unit pixel P may have a substantially regular hexagonal shape, or alternatively a polygonal shape or a circular shape.

3. Application Example

Figure 21:
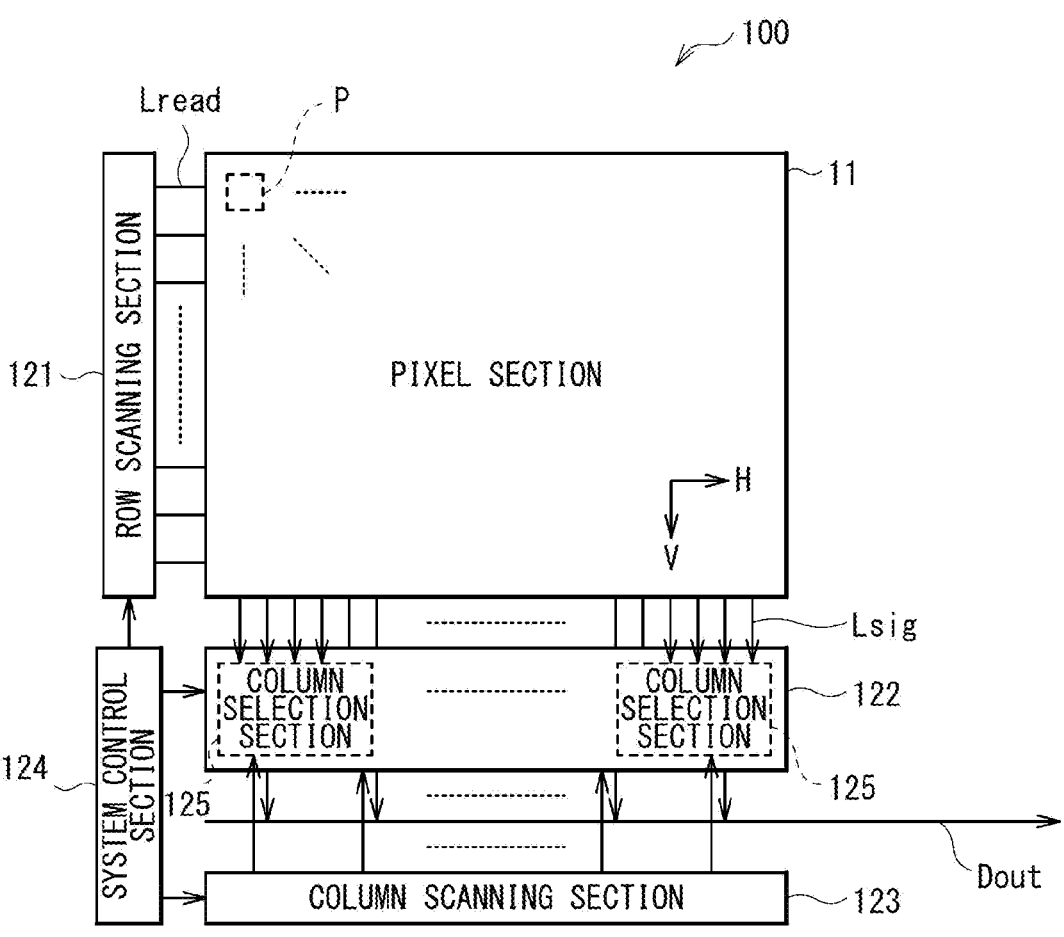
FIG. 21 is a block diagram illustrating a configuration of an X-ray imaging device.

FIG. 21 illustrates a functional configuration of the X-ray imaging device 100 as an example of an electronic apparatus using the light-receiving device (e.g., light-receiving device 1) described in the foregoing embodiment and Modification Examples 1 to 6. The X-ray imaging device 100 reads information on a subject (captures an image of a subject) on the basis of an incident radioactive ray Rrad (e.g., α-ray, β-ray, γ-ray, and X-ray, etc.), for example. The X-ray imaging device 100 includes a pixel section (light-receiving region 110A), and includes, as a drive circuit (peripheral circuit section) of the light-receiving region 110A, a row scanning section 121, an A/D conversion section 122, a column scanning section 123, and a system control section 124.

(Light-Receiving Region 110A)

The light-receiving region 110A includes a plurality of unit pixels (imaging pixels) P that generates signal charge on the basis of a radioactive ray. The plurality of unit pixels P are arranged two-dimensionally in matrix (in a matrix shape). It is to be noted that, as illustrated in FIG. 1, a horizontal direction (row direction) in the light-receiving region 110A is defined as an "H" direction, and a vertical direction (column direction) is defined as a "V" direction.

(Row Scanning Section 121)

The row scanning section 121 includes a later-described shift register circuit, a predetermined logic circuit, and the like, and is a pixel drive section (row scanning circuit) that performs driving (line-sequential scanning), on a row-by-row basis (in unit of horizontal lines), on the plurality of unit pixels P in the light-receiving region 110A. Specifically, the row scanning section 121 performs an imaging operation such as a read operation or a reset operation on each of the unit pixels P by line-sequential scanning, for example. It is to be noted that the line-sequential scanning is performed by supplying each of the unit pixels P with a row scanning signal described above via a readout control line Lread.

(A/D Conversion Section 122)

The A/D conversion section 122 includes a plurality of column selection sections 125 each provided for every plurality of (four, in this example) signal lines Lsig, and performs A/D conversion (analog/digital conversion) on the basis of a signal voltage (voltage in response to signal charge) inputted via the signal line Lsig. This allows output data Dout (imaging signal) including a digital signal to be generated and outputted to the outside.

Figure 22:
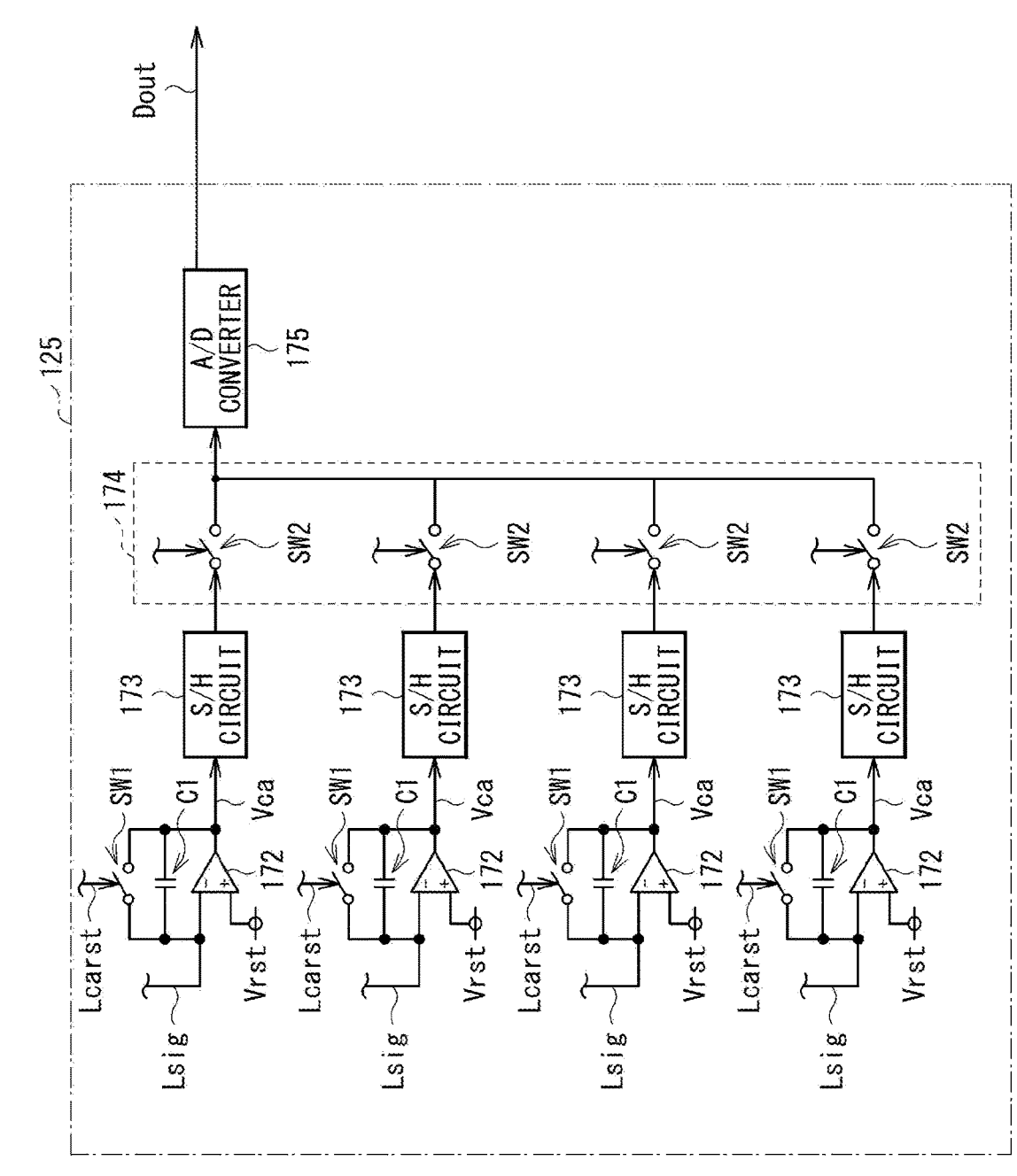
FIG. 22 is a block diagram illustrating a detailed configuration example of a column selection section illustrated in FIG. 21.

For example, as illustrated in FIG. 22, each of the column selection sections 125 includes a charge amplifier 172, a capacitor (condenser or feedback capacitor, etc.) C1, a switch SW1, a sample-and-hold (S/H) circuit 173, a multiplexer circuit (selection circuit) 174 including four switches SW2, and an A/D converter 175. Of these, the charge amplifier 172, the capacitor C1, the switch SW1, the S/H circuit 173, and the switch SW2 are provided for each of the signal lines Lsig. The multiplexer circuit 174 and the A/D converter 175 are provided for each of the column selection sections 125. It is to be noted that the charge amplifier 172, the capacitor C1, and the switch SW1 constitute a charge amplifier circuit.

The charge amplifier 172 is an amplifier (amplifier) to perform conversion (Q-V conversion) of signal charge read from the signal line Lsig. In the charge amplifier 172, one end of the signal line Lsig is coupled to an input terminal on a negative side (– side), and a predetermined reset voltage Vrst is inputted to an input terminal on a positive side (+ side). An output terminal and the input terminal on the negative of the charge amplifier 172 are feedback-coupled to each other (feedback coupling) via a parallel connection circuit of the capacitor C1 and the switch SW1. That is, one terminal of the capacitor C1 is coupled to the input terminal on the negative side of the charge amplifier 172, and another terminal thereof is coupled to the output terminal of the charge amplifier 172. Likewise, one terminal of the switch SW1 is coupled to the input terminal on the negative side of the charge amplifier 172, and another terminal thereof is coupled to the output terminal of the charge amplifier 172. It is to be noted that an ON/OFF state of the switch SW1 is controlled by a control signal (amplifier reset control signal) supplied from the system control section 124 via an amplifier reset control line Lcarst.

The S/H circuit 173 is disposed between the charge amplifier 172 and the multiplexer circuit 174 (switch SW2), and is a circuit to temporarily hold an output voltage Vca from the charge amplifier 172.

The multiplexer circuit 174 is a circuit that selectively couples or decouples each of the S/H circuits 173 and the A/D converter 175 to and from each other by sequentially bringing one of the four switches SW2 into an ON state in accordance with scan driving by the column scanning section 123.

The A/D converter 175 is a circuit that generates and outputs the above-described output data Dout by performing A/D conversion on an output voltage inputted via the switch SW2 from the S/H circuit 173.

(Column Scanning Section 123)

The column scanning section 123 includes, for example, an unillustrated shift register, address decoder, and the like, and drives the switches SW2 in sequence in the above-described column selection section 125 while scanning. Such selective scanning by the column scanning section 123 allows signals (output data Dout described above) of the respective unit pixels P read via the respective signal lines Lsig to be outputted in sequence to the outside.

(System Control Section 124)

The system control section 124 controls respective operations of the row scanning section 121, the A/D conversion section 122, and the column scanning section 123. Specifically, the system control section 124 includes a timing generator that generates various timing signals (control signals) described above, and performs drive control of the row scanning section 121, the A/D conversion section 122, and the column scanning section 123 on the basis of the various timing signals generated by the timing generator. On the basis of the control of the system control section 124, the row scanning section 121, the A/D conversion section 122, and the column scanning section 123 each perform imaging driving (line-sequential imaging driving) on the plurality of unit pixels P in the light-receiving region 110A, thereby allowing the output data Dout to be acquired from the light-receiving region 110A.

Although the description has been given above by referring to the embodiment, Modification Examples 1 to 7, and the application example, the contents of the present disclosure are not limited to the foregoing embodiment, and the like, and may be modified in a wide variety of ways. For example, the foregoing embodiment, and the like exemplify the use of holes as signal charge; however, electrons may be used as the signal charge. It is to be noted that, in that case, each member has an electrically-conductive type which is the opposite electrically-conductive type.

In addition, the configuration of the unit pixel P (light-receiving element) described in the foregoing embodiment, and the like is merely exemplary, and another impurity region may further be included. Further, the materials or the thicknesses of the respective layers are also exemplary, and are not limited to those described above. Furthermore, although the foregoing application example mentions the X-ray imaging device 100, the light-receiving device 1 described in the foregoing embodiment, and the like is also applicable to a radiation imaging device or an electromagnetic wave detector of which application is not limited to an X-ray.

It is to be noted that the effects described herein are merely exemplary and non-limiting, and may have other effects.

It is to be noted that the present disclosure may also have the following configurations. According to the present technology of the following configurations, around a light-receiving region, in which a plurality of light-receiving elements are arranged two-dimensionally in matrix, the plurality of light-receiving elements each including: a first first electrically-conductive region provided at an interface of a first surface of the semiconductor substrate and coupled to a first electrode; a second first electrically-conductive region provided around the first first electrically-conductive region and coupled to a second electrode; and a third first electrically-conductive region provided therearound and being in an electrically floating state, a fourth first electrically-conductive region in an electrically floating state is provided, and a first second electrically-conductive region facing the second first electrically-conductive region and the third first electrically-conductive region and further extending to the fourth first electrically-conductive region is embedded and formed in the semiconductor substrate. This makes it possible to reduce fluctuation in a potential of the light-receiving element arranged on the outermost periphery of the light-receiving region and thus to reduce dispersion of pixel characteristics in the light-receiving region.

(1)

A light-receiving device including:

a semiconductor substrate including a light-receiving region in which a plurality of light-receiving elements are arranged two-dimensionally in matrix, and a peripheral region provided around the light-receiving region;

a first first electrically-conductive region provided at an interface of a first surface of the semiconductor substrate for each of the light-receiving elements and coupled to a first electrode, in the light-receiving region;

a second first electrically-conductive region provided around the first first electrically-conductive region provided for each of the light-receiving elements and coupled to a second electrode, at the interface of the first surface;

a third first electrically-conductive region provided around the second first electrically-conductive region provided for each of the light-receiving elements and being in an electrically floating state, at the interface of the first surface;

a fourth first electrically-conductive region provided at the interface of the first surface of the semiconductor substrate around the light-receiving region and being in an electrically floating state, in the peripheral region; and a first second electrically-conductive region embedded and formed in the semiconductor substrate and facing the second first electrically-conductive region, the third first electrically-conductive region, and the fourth first electrically-conductive region.

(2)

The light-receiving device according to (1), in which, at a boundary position between the light-receiving region and the peripheral region, the third first electrically-conductive region and the first second electrically-conductive region provided in an outermost peripheral one of the light-receiving elements of the light-receiving region and the fourth first electrically-conductive region and the first second electrically-conductive region provided in the peripheral region have a mirror symmetry in a cross-sectional view.

(3)

The light-receiving device according to (1) or (2), further including a fifth first electrically-conductive region provided around the light-receiving region with the fourth first electrically-conductive region interposed therebetween, the fifth first electrically-conductive region receiving application of a fixed electric potential.

(4)

The light-receiving device according to (1) or (2), in which the first second electrically-conductive region facing the fourth first electrically-conductive region in the peripheral region has a higher impurity concentration than the first second electrically-conductive region provided in the light-receiving region.

(5)

The light-receiving device according to any one of (1) to (4), in which the third first electrically-conductive region includes a plurality of third first electrically-conductive regions, and the fourth first electrically-conductive region includes a plurality of fourth first electrically-conductive regions, and the number of the fourth first electrically-conductive regions is larger than the number of the third first electrically-conductive regions.

(6)

The light-receiving device according to any one of (1) to (4), in which the third first electrically-conductive region includes a plurality of third first electrically-conductive regions, and the fourth first electrically-conductive region includes a plurality of fourth first electrically-conductive regions, and the light-receiving device further includes, at the interface of the first surface, a second second electrically-conductive region being provided between the third first electrically-conductive regions adjacent to each other, between the third first electrically-conductive region and the fourth first electrically-conductive region adjacent to each other, and between the fourth first electrically-conductive regions adjacent to each other.

(7)

The light-receiving device according to (6), in which the second second electrically-conductive region provided between the plurality of fourth first electrically-conductive regions has a higher impurity concentration than the second second electrically-conductive region provided between the plurality of third first electrically-conductive regions.

(8)

The light-receiving device according to (6), in which a width of the second second electrically-conductive region provided between the plurality of fourth first electrically-conductive regions is wider than a width of the second second electrically-conductive region provided between the plurality of third first electrically-conductive regions.

(9)

The light-receiving device according to any one of (1) to (8), further including, on a side of a second surface opposed to the first surface of the semiconductor substrate, a sixth first electrically-conductive region embedded and formed in the semiconductor substrate, the sixth first electrically-conductive region facing the first second electrically-conductive region.

(10)

The light-receiving device according to (9), in which the sixth first electrically-conductive region is provided only in the light-receiving region.

(11)

The light-receiving device according to (9) or (10), in which the sixth first electrically-conductive region extends to below the first first electrically-conductive region, and the first first electrically-conductive region and the sixth first electrically-conductive region are coupled to each other.

(12)

The light-receiving device according to any one of (1) to (11), in which the fourth first electrically-conductive region is provided continuously around the light-receiving region, and meanders in accordance with pitches of the plurality of light-receiving elements arranged two-dimensionally in matrix in the light-receiving region.

(13)

The light-receiving device according to any one of (1) to (12), in which the fourth first electrically-conductive region is provided around the light-receiving region independently for each row and each column of the plurality of light-receiving elements arranged two-dimensionally in matrix in the light-receiving region.

(14)

The light-receiving device according to (13), in which the fourth first electrically-conductive region includes the plurality of fourth first electrically-conductive regions, and an interval between the plurality of fourth first electrically-conductive regions becomes wider as being closer to a terminal part.

(15)

The light-receiving device according to any one of (1) to (14), in which the light-receiving elements each have a substantially rectangular or substantially regular hexagonal planar shape.

(16)

The light-receiving device according to any one of (1) to (15), in which the semiconductor substrate includes an intrinsic semiconductor.

(17)

The light-receiving device according to any one of (1) to (16), in which the semiconductor substrate includes a depletion region in the light-receiving region, and the semiconductor substrate includes a neutral region in the peripheral region.

(18)

The light-receiving device according to (17), in which the light-receiving elements each include a P-N junction light-receiving element that applies a reverse bias between the first surface of the semiconductor substrate and the second surface opposed to the first surface.

(19)

An X-ray imaging device including:

a plurality of light-receiving elements generating signal charge based on an X-ray;

a semiconductor substrate including a light-receiving region in which the plurality of light-receiving elements are arranged two-dimensionally in matrix, and a peripheral region provided around the light-receiving region;

a first first electrically-conductive region provided at an interface of a first surface of the semiconductor substrate for each of the light-receiving elements and coupled to a first electrode, in the light-receiving region;

a second first electrically-conductive region provided around the first first electrically-conductive region provided for each of the light-receiving elements and coupled to a second electrode, at the interface of the first surface;

a third first electrically-conductive region provided around the second first electrically-conductive region provided for each of the light-receiving elements and being in an electrically floating state, at the interface of the first surface;

a fourth first electrically-conductive region provided at the interface of the first surface of the semiconductor substrate around the light-receiving region and being in an electrically floating state, in the peripheral region; and a first second electrically-conductive region embedded and formed in the semiconductor substrate and facing the second first electrically-conductive region, the third first electrically-conductive region, and the fourth first electrically-conductive region.

(20)

An electronic apparatus including an X-ray imaging device, the X-ray imaging device including a plurality of light-receiving elements generating signal charge based on an X-ray, a semiconductor substrate including a light-receiving region in which the plurality of light-receiving elements are arranged two-dimensionally in matrix, and a peripheral region provided around the light-receiving region, a first first electrically-conductive region provided at an interface of a first surface of the semiconductor substrate for each of the light-receiving elements and coupled to a first electrode, in the light-receiving region, a second first electrically-conductive region provided around the first first electrically-conductive region provided for each of the light-receiving elements and coupled to a second electrode, at the interface of the first surface, a third first electrically-conductive region provided around the second first electrically-conductive region provided for each of the light-receiving elements and being in an electrically floating state, at the interface of the first surface, a fourth first electrically-conductive region provided at the interface of the first surface of the semiconductor substrate around the light-receiving region and being in an electrically floating state, in the peripheral region, and a first second electrically-conductive region embedded and formed in the semiconductor substrate and facing the second first electrically-conductive region, the third first electrically-conductive region, and the fourth first electrically-conductive region.

This application claims the benefit of Japanese Priority Patent Application JP2021-112165 filed with the Japan Patent Office on Jul. 6, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A light-receiving device, comprising:

a semiconductor substrate including a light-receiving region in which a plurality of light-receiving elements are arranged two-dimensionally in a matrix, and a peripheral region provided around the light-receiving region;

a first first electrically-conductive region provided at a first surface of the semiconductor substrate for each of the light-receiving elements, wherein the first first electrically-conductive region is coupled to a first electrode, and wherein the first first electrically-conductive region is in the light-receiving region;

a second first electrically-conductive region provided at the first surface and around the first first electrically-conductive region provided for each of the light-receiving elements, wherein the second first electrically-conductive region is coupled to a second electrode;

a third first electrically-conductive region provided at the first surface and around the second first electrically-conductive region provided for each of the light-receiving elements, wherein the third first electrically-conductive region is in an electrically floating state;

a fourth first electrically-conductive region provided at the first surface of the semiconductor substrate and around the light-receiving region, wherein the fourth first electrically-conductive region is in an electrically floating state, and wherein the fourth first electrically-conductive region is in the peripheral region; and a first second electrically-conductive region embedded and formed in the semiconductor substrate and facing the second first electrically-conductive region, the third first electrically-conductive region, and the fourth first electrically-conductive region, wherein, at a boundary position between the light-receiving region and the peripheral region, the third first electrically-conductive region and the first second electrically-conductive region provided in an outermost peripheral one of the light-receiving elements of the light-receiving region and the fourth first electrically-conductive region and the first second electrically-conductive region provided in the peripheral region have a mirror symmetry in a cross-sectional view, wherein the first, second, third, and fourth first electrically-conductive regions are first conductivity type electrically-conductive regions, and wherein the first second electrically-conductive region is a second conductivity type electrically-conductive region.

2. The light-receiving device according to claim 1, wherein the first second electrically-conductive region facing the fourth first electrically-conductive region in the peripheral region has a higher impurity concentration than the first second electrically-conductive region provided in the light-receiving region.

3. The light-receiving device according to claim 1, wherein the third first electrically-conductive region comprises a plurality of third first electrically-conductive regions, and the fourth first electrically-conductive region comprises a plurality of fourth first electrically-conductive regions, and a number of the fourth first electrically-conductive regions is larger than a number of the third first electrically-conductive regions.

4. The light-receiving device according to claim 1, wherein the fourth first electrically-conductive region is provided around the light-receiving region independently for each row and each column of the plurality of light-receiving elements arranged two-dimensionally in matrix in the light-receiving region.

5. The light-receiving device according to claim 4, wherein the fourth first electrically-conductive region comprises a plurality of fourth first electrically-conductive regions, and an interval between the plurality of fourth first electrically-conductive regions becomes wider as being closer to a terminal part.

6. The light-receiving device according to claim 1, wherein the light-receiving elements each have a substantially rectangular or substantially regular hexagonal planar shape.

7. The light-receiving device according to claim 1, wherein the semiconductor substrate includes an intrinsic semiconductor.

8. The light-receiving device according to claim 1, wherein the semiconductor substrate includes a depletion region in the light-receiving region, and the semiconductor substrate includes a neutral region in the peripheral region.

9. The light-receiving device according to claim 8, wherein the light-receiving elements each comprise a P-N junction light-receiving element that applies a reverse bias between the first surface of the semiconductor substrate and a second surface opposed to the first surface.

10. A light-receiving device, comprising:

a semiconductor substrate including a light-receiving region in which a plurality of light-receiving elements are arranged two-dimensionally in a matrix, and a peripheral region provided around the light-receiving region;

a first first electrically-conductive region provided at a first surface of the semiconductor substrate for each of the light-receiving elements, wherein the first first electrically-conductive region is coupled to a first electrode, and wherein the first first electrically-conductive region is in the light-receiving region;

a second first electrically-conductive region provided at the first surface and around the first first electrically-conductive region provided for each of the light-receiving elements, wherein the second first electrically-conductive region is coupled to a second electrode;

a third first electrically-conductive region provided at the first surface and around the second first electrically-conductive region provided for each of the light-receiving elements, wherein the third first electrically-conductive region is in an electrically floating state;

a fourth first electrically-conductive region provided at the first surface of the semiconductor substrate and around the light-receiving region, wherein the fourth first electrically-conductive region is in an electrically floating state, and wherein the fourth first electrically-conductive region is in the peripheral region;

a first second electrically-conductive region embedded and formed in the semiconductor substrate and facing the second first electrically-conductive region, the third first electrically-conductive region, and the fourth first electrically-conductive region; and a fifth first electrically-conductive region provided around the light-receiving region with the fourth first electrically-conductive region interposed therebetween, the fifth first electrically-conductive region receiving application of a fixed electric potential, wherein the first, second, third, and fourth first electrically-conductive regions are first conductivity type electrically-conductive regions, and wherein the first second electrically-conductive region is a second conductivity type electrically-conductive region.

11. The light-receiving device according to claim 10, wherein, at a boundary position between the light-receiving region and the peripheral region, the third first electrically-conductive region and the first second electrically-conductive region provided in an outermost peripheral one of the light-receiving elements of the light-receiving region and the fourth first electrically-conductive region and the first second electrically-conductive region provided in the peripheral region have a mirror symmetry in a cross-sectional view.

12. A light-receiving device, comprising:

a semiconductor substrate including a light-receiving region in which a plurality of light-receiving elements are arranged two-dimensionally in a matrix, and a peripheral region provided around the light-receiving region;

a first first electrically-conductive region provided at a first surface of the semiconductor substrate for each of the light-receiving elements, wherein the first first electrically-conductive region is coupled to a first electrode, and wherein the first first electrically-conductive region is in the light-receiving region;

a second first electrically-conductive region provided at the first surface and around the first first electrically-conductive region provided for each of the light-receiving elements, wherein the second first electrically-conductive region is coupled to a second electrode;

a third first electrically-conductive region provided at the first surface and around the second first electrically-conductive region provided for each of the light-receiving elements, wherein the third first electrically-conductive region is in an electrically floating state;

a fourth first electrically-conductive region provided at the first surface of the semiconductor substrate and around the light-receiving region, wherein the fourth first electrically-conductive region is in an electrically floating state, and wherein the fourth first electrically-conductive region is in the peripheral region; and a first second electrically-conductive region embedded and formed in the semiconductor substrate and facing the second first electrically-conductive region, the third first electrically-conductive region, and the fourth first electrically-conductive region, wherein the third first electrically-conductive region comprises a plurality of third first electrically-conductive regions, and the fourth first electrically-conductive region comprises a plurality of fourth first electrically-conductive regions, wherein the light-receiving device further comprises, at the first surface, a second second electrically-conductive region being provided between the third first electrically-conductive regions adjacent to each other, between the third first electrically-conductive region and the fourth first electrically-conductive region adjacent to each other, and between the fourth first electrically-conductive regions adjacent to each other, wherein the first, second, third, and fourth first electrically-conductive regions are first conductivity type electrically-conductive regions, and wherein the first second electrically-conductive region is a second conductivity type electrically-conductive region.

13. The light-receiving device according to claim 12, wherein the second second electrically-conductive region provided between the plurality of fourth first electrically-conductive regions has a higher impurity concentration than the second second electrically-conductive region provided between the plurality of third first electrically-conductive regions.

14. The light-receiving device according to claim 12, wherein a width of the second second electrically-conductive region provided between the plurality of fourth first electrically-conductive regions is wider than a width of the second second electrically-conductive region provided between the plurality of third first electrically-conductive regions.

15. A light-receiving device, comprising:

a semiconductor substrate including a light-receiving region in which a plurality of light-receiving elements are arranged two-dimensionally in a matrix, and a peripheral region provided around the light-receiving region;

a first first electrically-conductive region provided at a first surface of the semiconductor substrate for each of the light-receiving elements, wherein the first first electrically-conductive region is coupled to a first electrode, and wherein the first first electrically-conductive region is in the light-receiving region;

a second first electrically-conductive region provided at the first surface and around the first first electrically-conductive region provided for each of the light-receiving elements, wherein the second first electrically-conductive region is coupled to a second electrode;

a third first electrically-conductive region provided at the first surface and around the second first electrically-conductive region provided for each of the light-receiving elements, wherein the third first electrically-conductive region is in an electrically floating state;

a fourth first electrically-conductive region provided at the first surface of the semiconductor substrate and around the light-receiving region, wherein the fourth first electrically-conductive region is in an electrically floating state, and wherein the fourth first electrically-conductive region is in the peripheral region;

a first second electrically-conductive region embedded and formed in the semiconductor substrate and facing the second first electrically-conductive region, the third first electrically-conductive region, and the fourth first electrically-conductive region; and on a side of a second surface opposed to the first surface of the semiconductor substrate, a sixth first electrically-conductive region embedded and formed in the semiconductor substrate, the sixth first electrically-conductive region facing the first second electrically-conductive region, wherein the first, second, third, and fourth first electrically-conductive regions are first conductivity type electrically-conductive regions, and wherein the first second electrically-conductive region is a second conductivity type electrically-conductive region.

16. The light-receiving device according to claim 15, wherein the sixth first electrically-conductive region is provided only in the light-receiving region.

17. The light-receiving device according to claim 16, wherein the sixth first electrically-conductive region extends to below the first first electrically-conductive region, and the first first electrically-conductive region and the sixth first electrically-conductive region are coupled to each other.

18. A light-receiving device, comprising:

a semiconductor substrate including a light-receiving region in which a plurality of light-receiving elements are arranged two-dimensionally in a matrix, and a peripheral region provided around the light-receiving region;

a first first electrically-conductive region provided at a first surface of the semiconductor substrate for each of the light-receiving elements, wherein the first first electrically-conductive region is coupled to a first electrode, and wherein the first first electrically-conductive region is in the light-receiving region;

a second first electrically-conductive region provided at the first surface and around the first first electrically-conductive region provided for each of the light-receiving elements, wherein the second first electrically-conductive region is coupled to a second electrode;

a third first electrically-conductive region provided at the first surface and around the second first electrically-conductive region provided for each of the light-receiving elements, wherein the third first electrically-conductive region is in an electrically floating state;

a fourth first electrically-conductive region provided at the first surface of the semiconductor substrate and around the light-receiving region, wherein the fourth first electrically-conductive region is in an electrically floating state, and wherein the fourth first electrically-conductive region is in the peripheral region; and a first second electrically-conductive region embedded and formed in the semiconductor substrate and facing the second first electrically-conductive region, the third first electrically-conductive region, and the fourth first electrically-conductive region, wherein the fourth first electrically-conductive region is provided continuously around the light-receiving region, and meanders in accordance with pitches of the plurality of light-receiving elements arranged two-dimensionally in matrix in the light-receiving region, wherein the first, second, third, and fourth first electrically-conductive regions are first conductivity type electrically-conductive regions, and wherein the first second electrically-conductive region is a second conductivity type electrically-conductive region.

19. An X-ray imaging device, comprising:

a plurality of light-receiving elements generating signal charge based on an X-ray;

a semiconductor substrate including a light-receiving region in which the plurality of light-receiving elements are arranged two-dimensionally in matrix, and a peripheral region provided around the light-receiving region;

a first first electrically-conductive region provided at a first surface of the semiconductor substrate for each of the light-receiving elements, wherein the first first electrically-conductive region is coupled to a first electrode, and wherein the first first electrically-conductive region is in the light-receiving region;

a second first electrically-conductive region provided at the first surface and around the first first electrically-conductive region provided for each of the light-receiving elements, wherein the second first electrically-conductive region is coupled to a second electrode;

a third first electrically-conductive region provided at the first surface and around the second first electrically-conductive region provided for each of the light-receiving elements, wherein the third first electrically-conductive region is in an electrically floating state;

a fourth first electrically-conductive region provided at the first surface of the semiconductor substrate and around the light-receiving region, wherein the fourth first electrically-conductive region is in an electrically floating state, and wherein the fourth first electrically-conductive region is in the peripheral region; and a first second electrically-conductive region embedded and formed in the semiconductor substrate and facing the second first electrically-conductive region, the third first electrically-conductive region, and the fourth first electrically-conductive region, wherein the first, second, third, and fourth first electrically-conductive regions are first conductivity type electrically-conductive regions, and wherein the first second electrically-conductive region is a second conductivity type electrically-conductive region.

20. An electronic apparatus comprising an X-ray imaging device, the X-ray imaging device including a plurality of light-receiving elements generating signal charge based on an X-ray, a semiconductor substrate including a light-receiving region in which the plurality of light-receiving elements are arranged two-dimensionally in matrix, and a peripheral region provided around the light-receiving region, a first first electrically-conductive region provided at a first surface of the semiconductor substrate for each of the light-receiving elements, wherein the first first electrically-conductive region is coupled to a first electrode, and wherein the first first electrically-conductive region is in the light-receiving region, a second first electrically-conductive region provided at the first surface and around the first first electrically-conductive region provided for each of the light-receiving elements, wherein the second first electrically-conductive region is coupled to a second electrode, a third first electrically-conductive region provided at the first surface and around the second first electrically-conductive region provided for each of the light-receiving elements, wherein the third first electrically-conductive region is in an electrically floating state, a fourth first electrically-conductive region provided at the first surface of the semiconductor substrate and around the light-receiving region, wherein the fourth first electrically-conductive region is an electrically floating state, in the peripheral region, and a first second electrically-conductive region embedded and formed in the semiconductor substrate and facing the second first electrically-conductive region, the third first electrically-conductive region, and the fourth first electrically-conductive region, wherein the first, second, third, and fourth first electrically-conductive regions are first conductivity type electrically-conductive regions, and wherein the first second electrically-conductive region is a second conductivity type electrically-conductive region.

* * * * *